(12) United States Patent
Sugahara et al.

(10) Patent No.: US 10,355,676 B2
(45) Date of Patent: Jul. 16, 2019

(54) ELECTRONIC CIRCUIT

(71) Applicant: JAPAN SCIENCE AND TECHNOLOGY AGENCY, Kawaguchi-shi, Saitama (JP)

(72) Inventors: Satoshi Sugahara, Yokohama (JP); Shuichiro Yamamoto, Yokohama (JP)

(73) Assignee: JAPAN SCIENCE AND TECHNOLOGY AGENCY, Kawaguchi-shi (JP)

( * ) Notice: Subject to any disclaimer, the term of this patent is extended or adjusted under 35 U.S.C. 154(b) by 62 days.

(21) Appl. No.: 15/558,059

(22) PCT Filed: Mar. 24, 2016

(86) PCT No.: PCT/JP2016/059453
§ 371 (c)(1),
(2) Date: Sep. 13, 2017

(87) PCT Pub. No.: WO2016/158691
PCT Pub. Date: Oct. 6, 2016

(65) Prior Publication Data
US 2018/0069534 A1    Mar. 8, 2018

(30) Foreign Application Priority Data

Apr. 1, 2015    (JP) .................................. 2015-075481

(51) Int. Cl.
    *H03K 3/037*      (2006.01)
    *H03K 3/3565*     (2006.01)
    (Continued)

(52) U.S. Cl.
    CPC .......... *H03K 3/3565* (2013.01); *G11C 11/412* (2013.01); *G11C 11/413* (2013.01);
    (Continued)

(58) Field of Classification Search
    CPC .. H03K 3/3565; H03K 3/02337; H03K 3/356; G11C 14/0054; G11C 11/413; G11C 11/412; G11C 5/148; H02M 7/42
    (Continued)

(56) References Cited

U.S. PATENT DOCUMENTS 5,945,859 A * 8/1999 Pang .................... H03K 3/3565
                                                    327/206
6,242,948 B1   6/2001 Makino
(Continued)

FOREIGN PATENT DOCUMENTS

JP          57-5424 A       1/1982
JP         9-223948 A       8/1997
(Continued)

OTHER PUBLICATIONS

International Search Report dated Jun. 14, 2016, issued in counterpart application No. PCT/JP2016/059453, w/English translation. (5 pages).

(Continued)

*Primary Examiner* — Ryan Jager
(74) *Attorney, Agent, or Firm* — Westerman, Hattori, Daniels & Adrian, LLP

(57) ABSTRACT

An electronic circuit includes: a bistable circuit connected between first and second power sources respectively supplied with first and second power-supply voltages and including first and second inverters connected in a loop being inverter circuits switching between first and second modes; a control circuit outputting first and second signals respectively setting the inverter circuits in the first and second modes to the inverter circuits; and a power-supply circuit supplying a first voltage as a power-supply voltage while the inverter circuits are in the first mode, and supplying a second voltage higher than the first voltage as the (Continued)

power-supply voltage while the inverter circuits are in the second mode, wherein the first mode exhibits hysteresis in a transfer characteristic curve and the second mode exhibits no hysteresis in a transfer characteristic curve, and/or the first mode has a steeper transfer characteristic curve than the second mode.

13 Claims, 23 Drawing Sheets

(51) Int. Cl.
| | | |
|---|---|---|
| *G11C 11/412* | (2006.01) | |
| *G11C 11/413* | (2006.01) | |
| *H03K 3/356* | (2006.01) | |
| *H02M 7/42* | (2006.01) | |
| *G11C 14/00* | (2006.01) | |
| *H03K 3/0233* | (2006.01) | |
| *G11C 5/14* | (2006.01) | |

(52) U.S. Cl.
CPC ........... *G11C 14/0054* (2013.01); *H02M 7/42* (2013.01); *H03K 3/02337* (2013.01); *H03K 3/356* (2013.01); *G11C 5/148* (2013.01)

(58) Field of Classification Search
USPC .................................................. 327/225, 205
See application file for complete search history.

(56) References Cited

U.S. PATENT DOCUMENTS

| | | | | |
|---|---|---|---|---|
| 6,285,213 B1* | 9/2001 | Makino | ............ | H03K 3/356008 326/81 |
| 6,359,474 B1 | 3/2002 | Sato | | |
| 6,836,175 B2* | 12/2004 | Morikawa | ............... | G11C 5/063 327/534 |
| 6,870,413 B1* | 3/2005 | Chang | ................... | H03K 3/3565 327/205 |
| 8,115,531 B1 | 2/2012 | Brown et al. | | |
| 8,289,755 B1* | 10/2012 | Rahim | ................ | G11C 11/4125 365/154 |
| 8,736,333 B1* | 5/2014 | Tercariol | .............. | H03K 3/3565 327/205 |
| 2010/0214863 A1* | 8/2010 | Chan | ...................... | G11C 5/147 365/228 |
| 2015/0070974 A1 | 3/2015 | Shuto et al. | | |

FOREIGN PATENT DOCUMENTS

| | | |
|---|---|---|
| JP | 11-214962 A | 8/1999 |
| JP | 2001-111409 A | 4/2001 |
| JP | 2001-185996 A | 7/2001 |
| JP | 2004-241021 A | 8/2004 |
| JP | 2005-236972 A | 9/2005 |
| JP | 2014-103447 A | 6/2014 |
| WO | 2013/172066 A1 | 11/2013 |

OTHER PUBLICATIONS

Office Action dated Oct. 25, 2017, issued in counterpart Taiwanese Application No. 105110066, with English translation. (11 pages).
Extended (Supplementary) European Search Report dated Feb. 28, 2018, issued in counterpart European Application No. 16772572.0 (8 pages).

* cited by examiner

FIG. 13
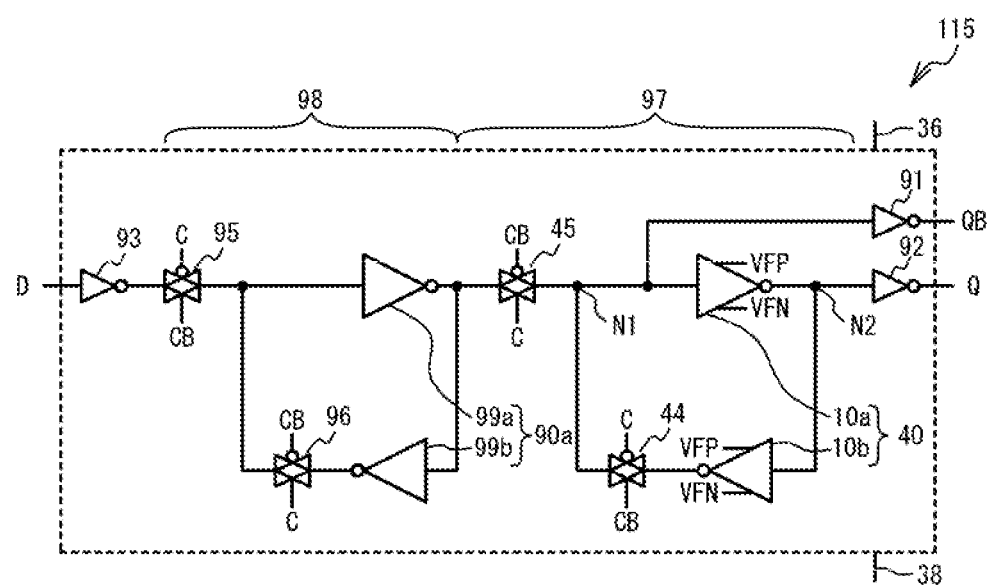
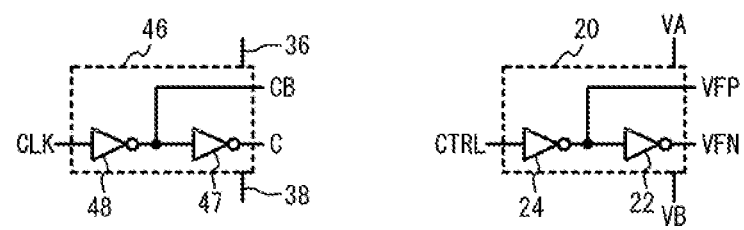

| MODE | | HYSTERESIS | POWER-SUPPLY VOLTAGE | OPERATION |
|---|---|---|---|---|
| INVERTER MODE | SECOND MODE | NOT EXIST | HIGH | HIGH-SPEED OPERATION |
| SCHMITT TRIGGER MODE | THIRD MODE | SMALL | MEDIUM | LOW POWER CONSUMPTION OPERATION |
| | FIRST MODE | LARGE | LOW | DATA RETENTION WITH LOW POWER CONSUMPTION |

ELECTRONIC CIRCUIT

TECHNICAL FIELD

The present invention relates to an electronic circuit, and for example, to an electronic circuit including an inverter circuit.

BACKGROUND ART

A power gating (PG) technology has been proposed as a technology to reduce the power consumption of integrated circuits such as complementary metal oxide semiconductor (CMOS) integrated circuits and the like. One of the challenges in the power gating technology is retaining information at the time of power shut-down. To retain information at the time of power shut-down, using a non-volatile circuit such as a non-volatile memory for a memory circuit has been studied (Patent Document 1). A low-voltage driving technique has been also studied to reduce the power consumption of the integrated circuit.

PRIOR ART DOCUMENT

Patent Document

Patent Document 1: International Publication No. 2013/172066

SUMMARY OF THE INVENTION

Problem to be Solved by the Invention

However, the use of non-volatile memories for memory circuits composed of CMOS circuits deteriorates the performance of the system such as operating speed, and complicates the fabrication process. The reduction of the power-supply voltage of a logic circuit deteriorates the circuit performance such as the variation tolerance and the noise tolerance of the transistor, making stable operation difficult.

The present invention has been made in view of the above problems, and aims to reduce the power consumption of an electronic circuit.

Means for Solving the Problem

The present invention is an electronic circuit characterized by including: a bistable circuit connected between a positive power source and a negative power source that are supplied with power-supply voltages, the bistable circuit including a first inverter and a second inverter connected in a loop, the first inverter and the second inverter being inverter circuits configured to switch between a first mode and a second mode; a control circuit configured to output a first signal and a second signal to the inverter circuits, the first signal setting the inverter circuits in the first mode, the second signal setting the inverter circuits in the second mode; and a power-supply circuit configured to supply a first voltage as the power-supply voltage while the inverter circuits are in the first mode, and supply a second voltage higher than the first voltage as the power-supply voltage while the inverter circuits are in the second mode, wherein the first mode is a mode that exhibits hysteresis in a transfer characteristic and the second mode is a mode that exhibits no hysteresis in a transfer characteristic, and/or the first mode is a mode of which the transfer characteristic is steeper than the transfer characteristic of the second mode.

In the above configuration, the electronic circuit may be configured so that the bistable circuit retains data and does not write or read data in the first mode, and write and read data in the second mode.

In the above configuration, the electronic circuit may be configured so that the power-supply circuit switches the second voltage to the first voltage after the control circuit has output the first signal, and switches the first voltage to the second voltage before the control circuit outputs the second signal.

In the above configuration, the electronic circuit may be configured so that the inverter circuits switch among the first mode, the second mode, and a third mode, the third mode exhibits the hysteresis smaller than the hysteresis of the first mode and/or has a transfer characteristic steeper than the transfer characteristic of the second mode, the control circuit outputs a third signal setting the inverter circuits in the third mode to the inverter circuits, and the power-supply circuit supplies a third voltage lower than the second voltage as the power-supply voltage while the inverter circuits are in the third mode.

In the above configuration, the electronic circuit may be configured to include: a switch configured to turn on and off in synchronization with a clock signal, the switch being located in a loop formed by the first inverter and the second inverter; and a clock supply circuit configured to supply the clock signal to the switch while the first inverter and the second inverter are in the second mode and not to supply the clock signal to the switch while the first inverter and the second inverter are in the first mode.

In the above configuration, the electronic circuit may be configured so that each of the inverter circuits includes: a first P-channel FET and a first N-channel FET, a source of the first P-channel FET being coupled to the positive power source, a source of the first N-channel FET being coupled to the negative power source, at least one of the first P-channel FET and the first N-channel FET being connected in series in a plurality; an input node to which a gate of the first P-channel FET and a gate of the first N-channel FET are commonly coupled; an output node to which one drain of the first P-channel FET and one drain of the first N-channel FET are commonly coupled; and a second FET that is at least one of a second P-channel FET and a second N-channel FET that are of a conductive type identical to a conductive type of the at least one of the first P-channel FET and the first N-channel FET connected in series in a plurality, one of a source and a drain of the second FET being coupled to an intermediate node located between a plurality of first FETs, which are the at least one of the first P-channel FET and the first N-channel FET connected in series in a plurality, a gate of the second FET being coupled to the output node, and another of the source and the drain of the second FET being coupled to a control node to which the first signal and the second signal are input.

In the above configuration, the electronic circuit may be configured so that the control circuit outputs, as the first signal, a low level to a control node of the second P-channel FET and/or a high level to a control node of the second N-channel FET, and the control circuit outputs, as the second signal, a high level to the control node of the second P-channel FET and/or a low level to the control node of the second N-channel FET.

In the above configuration, the electronic circuit may be configured so that the first P-channel FET is connected in series in a plurality and the first N-channel FET is connected in series in a plurality, the second FET includes the second P-channel FET and the second N-channel FET, and the control circuit outputs, as the first signal, a low level to the control node of the second P-channel FET and a high level to the control node of the second N-channel FET, and outputs, as the second signal, a high level to the control node of the second P-channel FET and a low level to the control node of the second N-channel FET.

In the above configuration, the electronic circuit may be configured so that the power-supply circuit includes a MOSFET connected between at least one of the positive power source and the negative power source and the inverter circuits.

The present invention is an electronic circuit characterized by including: an inverter circuit including: a first P-channel FET and a first N-channel FET, a source of the first P-channel FET being coupled to a positive power source, a source of the first N-channel FET being coupled to a negative power source, the positive power source and the negative power source being supplied with power-supply voltages, at least one of the first P-channel FET and the first N-channel FET being connected in series in a plurality; an input node to which a gate of the first P-channel FET and a gate of the first N-channel FET are commonly coupled; an output node to which one drain of the first P-channel FET and one drain of the first N-channel FET are commonly coupled; and a second FET that is at least one of a second P-channel FET and a second N-channel FET that are of a conductive type identical to a conductive type of the at least one of the first P-channel FET and the first N-channel FET connected in series in a plurality, one of a source and a drain of the second FET being coupled to an intermediate node located between a plurality of first FETs, which are the at least one of the first P-channel FET and the first N-channel FET connected in series in a plurality, a gate of the second FET being coupled to the output node, and another of the source and the drain of the second FET being coupled to a control node; and a control circuit configured to output a first signal and a second signal to a control node of the second FET, the first signal setting the inverter circuit in a first mode, the second signal setting the inverter circuit in a second mode, wherein the control circuit is configured to output, as the first signal, a low level to a control node of the second P-channel FET and/or a high level to a control node of the second N-channel FET, and output, as the second signal, a high level to the control node of the second P-channel FET and/or a low level to the control node of the second N-channel FET, and the first mode is a mode that exhibits hysteresis in a transfer characteristic, the second mode is a mode that exhibits no hysteresis in a transfer characteristic, and/or the first mode is a mode of which the transfer characteristic is steeper than the transfer characteristic of the second mode.

In the above configuration, the electronic circuit may be configured so that the first P-channel FET is connected in series in a plurality and the first N-channel FET is connected in series in a plurality; the second FET includes the second P-channel FET and the second N-channel FET; and the control circuit outputs, as the first signal, a low level to the control node of the second P-channel FET and a high level to the control node of the second N-channel FET, and outputs, as the second signal, a high level to the control node of the second P-channel FET and a low level to the control node of the second N-channel FET.

In the above configuration, the electronic circuit may be configured to further include a power-supply circuit configured to supply a first voltage as the power-supply voltage while the inverter circuit is in the first mode, and supply a second voltage higher than the first voltage as the power-supply voltage while the inverter circuit is in the second mode.

In the above configuration, the electronic circuit may be configured to include a logic circuit including the inverter circuit.

The present invention is an electronic circuit characterized by including: a bistable circuit connected between a positive power source and a negative power source that are supplied with power-supply voltages, the bistable circuit including: a first inverter and a second inverter that form a loop; and a switch that turns on and off in synchronization with a clock signal and is located in the loop; a clock supply circuit configured to supply the clock signal to the switch; and a power-supply circuit configured to supply a first voltage as the power-supply voltage while the clock supply circuit is not supplying the clock signal, and supply a second voltage higher than the first voltage as the power-supply voltage while the clock supply circuit is supplying the clock signal.

Effects of the Invention

The present invention reduces the power consumption of an electronic circuit.

BRIEF DESCRIPTION OF THE DRAWINGS

FIG. 13 is a circuit diagram of an electronic circuit in accordance with a fifth variation of the second embodiment;

MODES FOR CARRYING OUT THE EMBODIMENTS

Figure 1A:
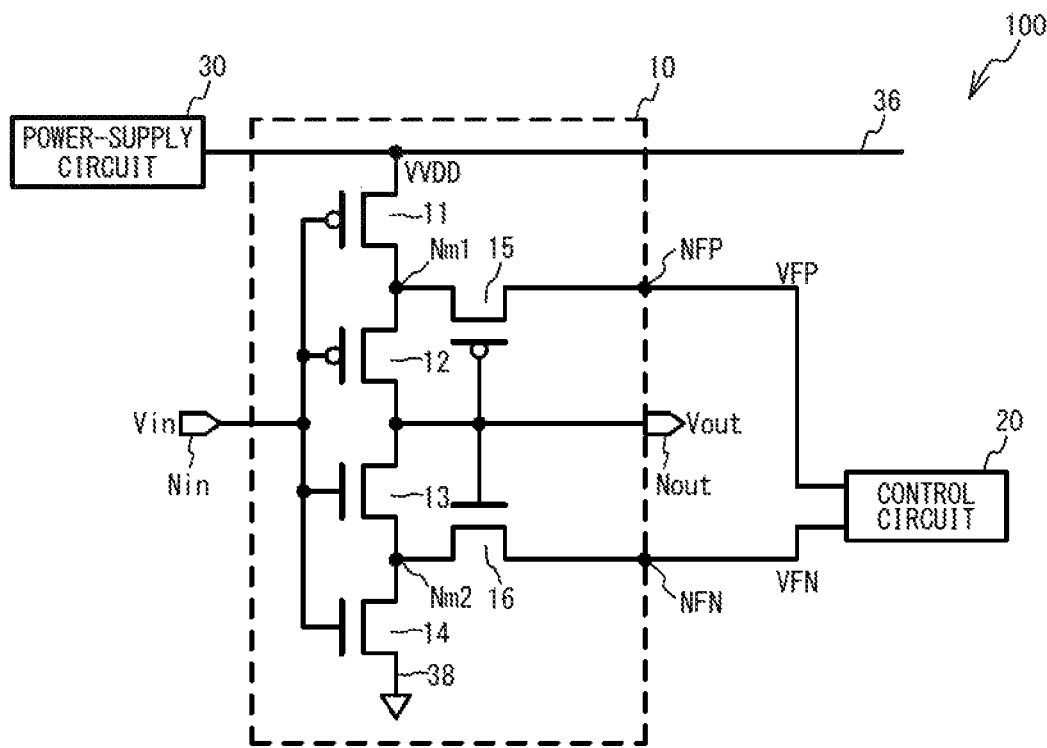
FIG. 1A and FIG. 1B are circuit diagrams of electronic circuits in accordance with a first embodiment.

The low voltage operation in a CMOS integrated circuit is very effective to reduce its power consumption. Memory circuits can reduce their standby power consumption, which is one of the important issues of the memory circuits, by retaining data at a low voltage. Logic circuits can increase their energy efficiency of computing by performing the low voltage operation although the operating speed decreases. Hereinafter, the current situation and challenges of the low voltage operation in the memory circuit and the logic circuit will be described.

One of the important challenges of the memory circuit is reduction of the power (standby power) consumed while the memory circuit retains data and is in the standby state. Power gating (PG) has been widely used as a standby power reduction technology in CMOS integrated circuits. However, in logic systems such as microprocessors, a volatile memory circuit is typically used in an area (a power domain) in which a power supply is shut off by PG. Thus, retention of the data in the power domain is an important challenge in PG.

A method of retaining data while keeping the supply voltage low to the extent that the data in the memory circuit is not lost (e.g., approximately 80% of the power-supply voltage) has been used for memory circuits composed of a static random access memory (SRAM) or the like. This method is effective to reduce standby power consumption, but is not as effective as the shut-off of the power supply because the voltage for retaining data cannot be drastically reduced. Therefore, this method does not reduce standby power consumption as much as original PG.

To perform effective PG for the memory circuit, retaining data with a non-volatile memory has been recently studied. This technique allows the data to be retained even when the power supply is shut off. Thus, PG with complete shut-off of the power supply can be performed, and the standby power consumption of the memory circuit is therefore reduced more. However, the deterioration of the circuit performance due to the use of the non-volatile memory becomes an issue. Thus, techniques including introduction of a non-volatile memory circuit capable of separating between memory operation without a non-volatile memory and non-volatile retention have been attempted. However, the mix of a non-volatile memory and a CMOS logic circuit has many issues including, for example, the complication of the fabrication process and the resultant increase in production cost, and therefore is not achieved yet.

A memory circuit using a bistable circuit composed of a Schmitt trigger inverter can retain data at a very low voltage (for example, 0.3 V or less). Thus, the standby power consumption can be greatly reduced to almost the same level as the power consumption obtained by shutting off the power supply. However, problems including the deterioration of the circuit performance such as decrease in its operating speed arise because of the structure of the Schmitt trigger inverter.

Thus, to greatly reduce the standby power consumption of the memory circuit, the memory circuit is demanded to retain data at a very low voltage (for example, at a virtual power source voltage generated when the power switch of the power domain is turned off, typically approximately 0.2 to 0.3 V) and operate at speed as sufficiently high as a conventional memory circuit (an SRAM or a flip-flop) in typical memory operations such as writing and/or reading.

A description will next be given of the current situation and challenges of the low voltage operation of the logic circuit. In recent years, ultra-low power consumption techniques have become more important because logic systems used for wearable devices need to be highly energy-efficient. The wearable device is also called an "always-on" device. To reduce the power consumption of the wearable devices, important are maximizing the energy efficiency of arithmetic processing and minimizing wasteful energy consumption.

Generally, the power consumption of the CMOS logic is reduced with reduction of the power-supply voltage. However, the energy consumption does not monotonically decrease with reduction of the power-supply voltage. When the power-supply voltage is reduced to a certain voltage, the energy consumption reaches the minimum value, and then rather increases as the voltage decreases. This is because as the voltage decreases, the operating speed of the CMOS rapidly decreases and the standby (static) energy consumed during the elongated operating time increases.

Information processing running in the background of the wearable device does not need to be high-speed computing. Thus, operations at a low voltage that minimize the energy consumption is considered important for the background computing. However, the voltage at which the energy has the minimum value is very low, approximately 0.3 to 0.5V. Thus, noise and variations in elements make the stable operation of the logic system difficult. In addition, normal voltage (full swing) operations not executed in the background require information processing at speed as high as smartphones.

Therefore, logic systems such as wearable devices are demanded to achieve: high energy efficiency and stable operation at a low voltage at which the energy has the minimum value, and high-speed computing at a normal voltage.

Embodiments described hereinafter provide memory circuits that operate at high speed during the drive at a normal voltage and retain data at a very low voltage with use of a memory circuit using an inverter circuit capable of operating in a Schmitt trigger inverter mode (also called a Schmitt trigger mode) and a normal inverter mode.

In addition, provided are logic circuits that achieve low voltage operation with high energy efficiency and high-speed operation during the drive at a normal voltage with use of a logic circuit using the inverter circuit capable of operating in the Schmitt trigger mode and normal inverter mode.

First Embodiment

Figure 1B:
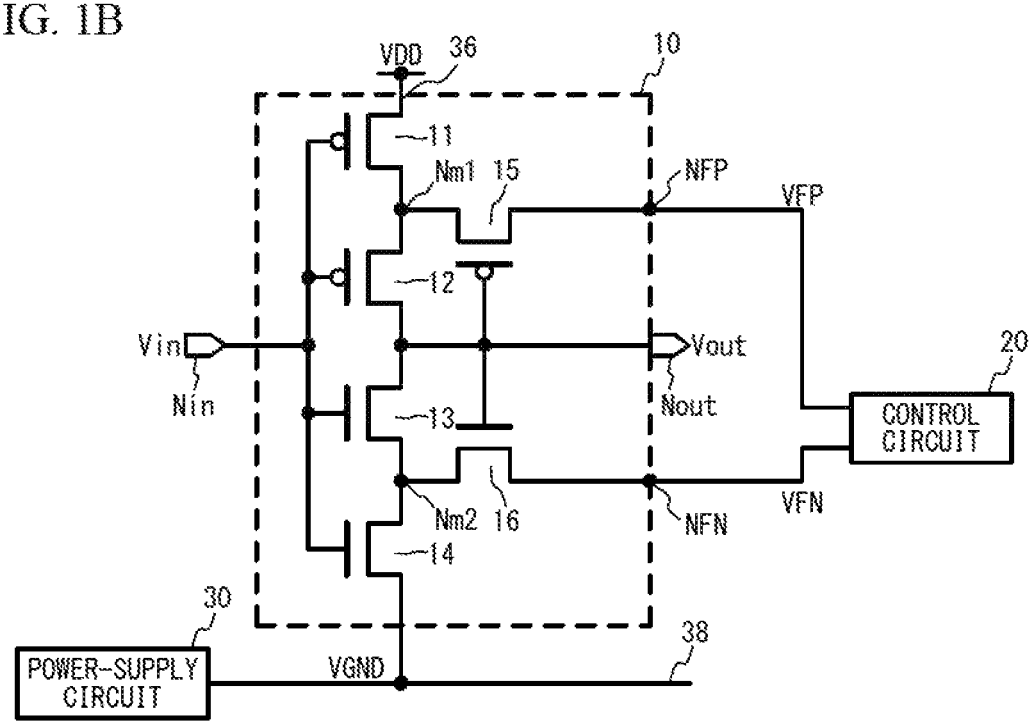

FIG. 1A and FIG. 1B are circuit diagrams of electronic circuits in accordance with a first embodiment. As illustrated in FIG. 1A, an electronic circuit 100 includes an inverter circuit 10, a control circuit 20, and a power-supply circuit 30. The inverter circuit 10 includes an input node Nin, an output node Nout, intermediate nodes Nm1 and Nm2, and field effect transistors (FETs) 11 through 16. The FETs 11, 12, and 15 are P-channel FETs. The FETs 11 and 12 are first P-channel FETs, and the FET 15 is a second P-channel FET. The FETs 13, 14, and 16 are N-channel FETs. The FETs 13 and 14 are first N-channel FETs, and the FET 16 is a second N-channel FET. The FETs 15 and 16 can function as feedback transistors to an inverter formed by the FETs 11 through 14.

A plurality of the FETs 11 through 14 are connected in series between a power-supply line 36 and a ground line 38. The source of the FET 11 is coupled to the power-supply line 36, and the source of the FET 14 is coupled to the ground line 38. The drain of the FET 11 and the source of the FET 12 are coupled to the intermediate node Nm1. The source of the FET 13 and the drain of the FET 14 are coupled to the intermediate node Nm2. The drains of the FETs 12 and 13 are commonly coupled to the output node. The gates of the FETs 11 through 14 are commonly coupled to the input node Nin.

One of the source and the drain of the FET 15 is coupled to the intermediate node Nm1, and the other of the source and the drain is coupled to a control node NFP. One of the source and the drain of the FET 16 is coupled to the intermediate node Nm2, the gate is coupled to the output node Nout, and the other of the source and the drain is coupled to a control node NFN.

The control circuit 20 applies a voltage VFP to the control node NFP and a voltage VFN to the control node NFN. The voltages VFP and VFN are set at a high level or a low level. When the control circuit 20 outputs the voltage VFP of high level and the voltage VFN of low level, the inverter circuit 10 operates as a typical inverter. This mode will be called an inverter mode. When the control circuit 20 outputs the voltage VFP of low level and the voltage VFN of high level, the inverter circuit 10 operates as a Schmitt trigger inverter. This mode will be called a Schmitt trigger mode. The high level corresponds to the voltage of the power-supply line 36, and the low level corresponds to the voltage of the ground line 38, for example. It is only required that the high level is greater than the low level in voltage in the inverter mode. Additionally, it is only required that the high level is greater than the low level in voltage also in the Schmitt trigger mode. The high level in the inverter mode may be the same as or different from the high level in the Schmitt trigger mode. The low level in the inverter mode may be the same as or different from the low level in the Schmitt trigger mode. For example, the high level may correspond to a power-supply voltage VDD supplied from a power source (see, for example, FIG. 17A), and the low level may correspond to a ground voltage.

The power-supply circuit 30 supplies a power-supply voltage between the power-supply line 36 and the ground line 38. The power-supply circuit 30 generates a virtual power-supply voltage VVDD from, for example the power-supply voltage supplied to the electronic circuit, and supplies the virtual power-supply voltage VVDD to the power-supply line 36. The power-supply circuit 30 switches between a first voltage and a second voltage higher than the first voltage as the virtual power-supply voltage VVDD. The power-supply circuit 30 is, for example, a power switch described later, a voltage regulator, or a direct current-direct current (DC-DC) converter.

In FIG. 1A, the power-supply circuit 30 is coupled to the power-supply line 36, sets the virtual power-supply voltage VVDD of the power-supply line 36 low when setting the power-supply voltage supplied between the power-supply line 36 and the ground line 38 low, and sets the virtual power-supply voltage VVDD high when setting the power-supply voltage high. As illustrated in FIG. 1B, the power-supply circuit 30 may be coupled to the ground line 38, set a virtual ground voltage VGND of the ground line 38 high when setting the power-supply voltage supplied between the power-supply line 36 and the ground line 38 low, and set the virtual ground voltage VGND low when setting the power-supply voltage high. The power-supply circuit 30 may switch both the virtual power-supply voltage VVDD and the virtual ground voltage VGND.

Figure 2A:
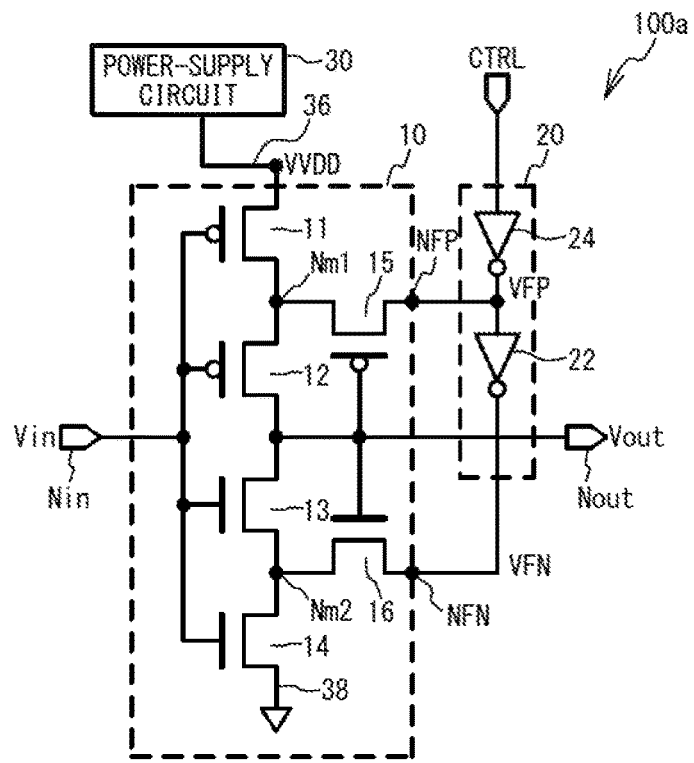
FIG. 2A and FIG. 2B are circuit diagrams of electronic circuits in accordance with a first variation of the first embodiment.
Figure 2B:
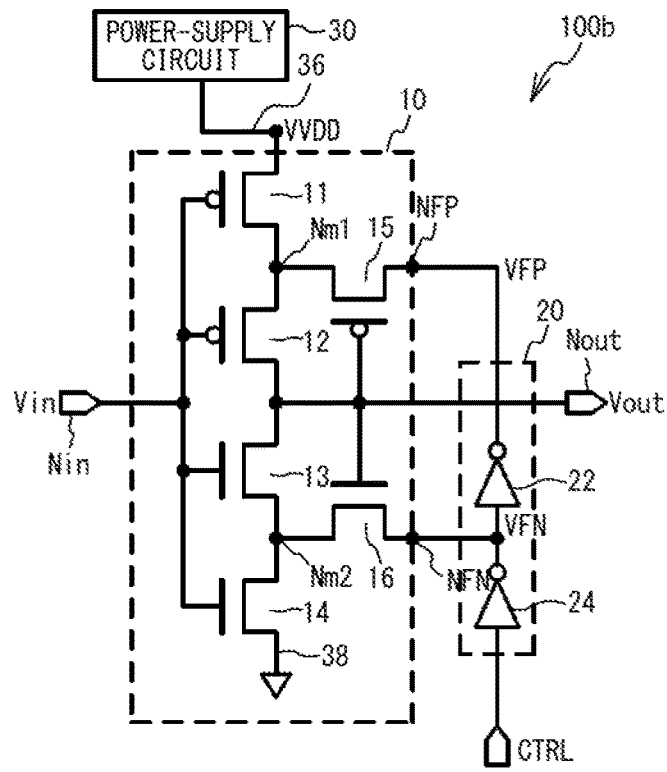

FIG. 2A and FIG. 2B are circuit diagrams of electronic circuits in accordance with a first variation of the first embodiment. As illustrated in FIG. 2A, in an electronic circuit 100a, the control circuit 20 includes inverters 22 and 24. A control signal CTRL is input to the input node of the inverter 24. The output node of the inverter 24 is coupled to the control node NFP. The input node of the inverter 22 is coupled to the output node of the inverter 24, and the output node of the inverter 22 is coupled to the control node NFN. The inverters 22 and 24 are supplied with the virtual power-supply voltage VVDD. Other structures are the same as those in FIG. 1A, and the description thereof is thus omitted. The inverter circuit 10 is set in the Schmitt trigger mode when the control signal CTRL is at a high level, while the inverter circuit 10 is set in the inverter mode when the control signal CTR is at a low level.

As illustrated in FIG. 2B, in an electronic circuit 100b, the output node of the inverter 24 is coupled to the control node NFN. The input node of the inverter 22 is coupled to the output node of the inverter 24, and the output node of the inverter 22 is coupled to the control node NFP. The inverter circuit 10 is set in the Schmitt trigger mode when the control signal CTRL is at a low level, while the inverter circuit 10 is set in the inverter mode when the control signal CTRL is at a high level. As illustrated in FIG. 2A, the control signal CTRL may be input from the control node NFP side. Alternatively, as illustrated in FIG. 2B, the control signal CTRL may be input from the control node NFN side.

Figure 3:
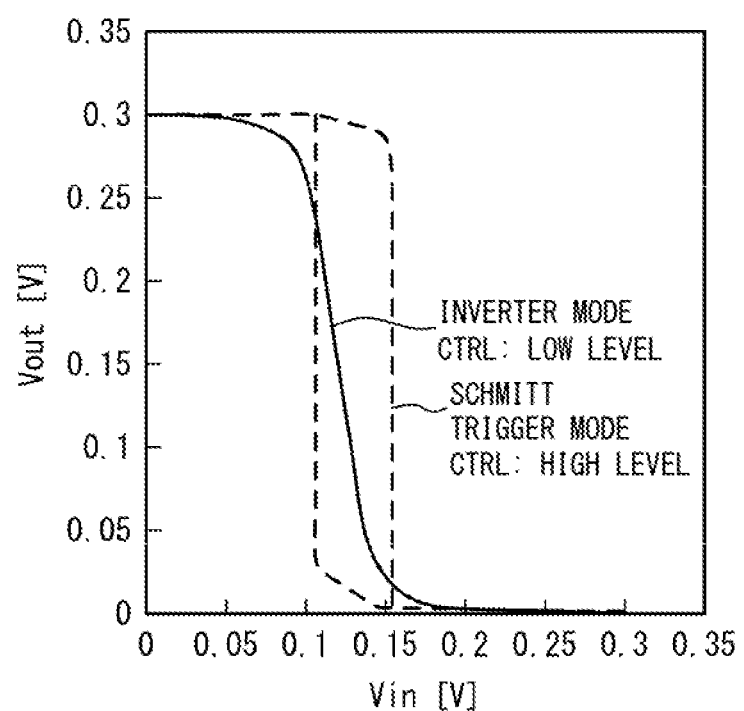
FIG. 3 illustrates the transfer characteristic of an inverter circuit in the first variation of the first embodiment.

Inverter characteristics were simulated using the electronic circuit 100a illustrated in FIG. 2A. FIG. 3 illustrates the transfer characteristic of the inverter circuit in the first variation of the first embodiment. The solid line indicates the transfer characteristic of the inverter mode when the control signal CTRL is at a low level. The dashed line indicates the transfer characteristic of the Schmitt trigger mode when the control signal CTRL is at a high level. As illustrated in FIG. 3, in the inverter mode, the FET 15 pushes up the intermediate node Nm1 to a high level, while the FET 16 pushes down the intermediate node Nm2 to a low level. Accordingly, the inverter circuit exhibits no hysteresis of the transfer characteristic, thus operating as a typical inverter. In the Schmitt trigger mode, the FETs 15 and 16 positively feedback the signal of the output node Nout to the intermediate nodes Nm1 and Nm2, respectively. Accordingly, hysteresis is generated in the transfer characteristic. In addition, an output voltage Vout rapidly changes from a high level to a low level and from the low level to the high level. Thus, in the Schmitt trigger mode, the inverter circuit 10 stably operates even while the virtual power-supply voltage VVDD is low.

Figure 4A:
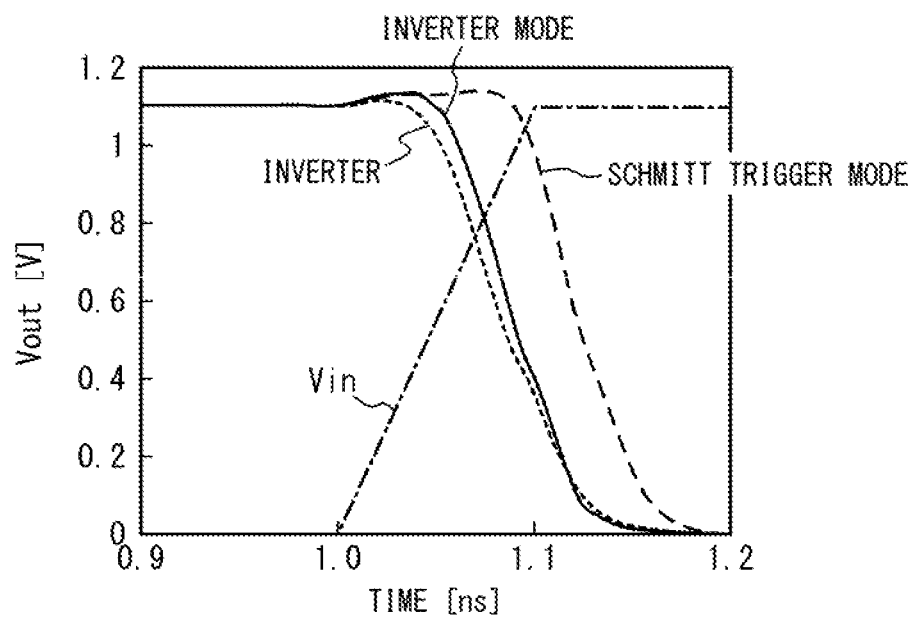
FIG. 4A and FIG. 4B are graphs of output voltage versus time in the first variation of the first embodiment.
Figure 4B:
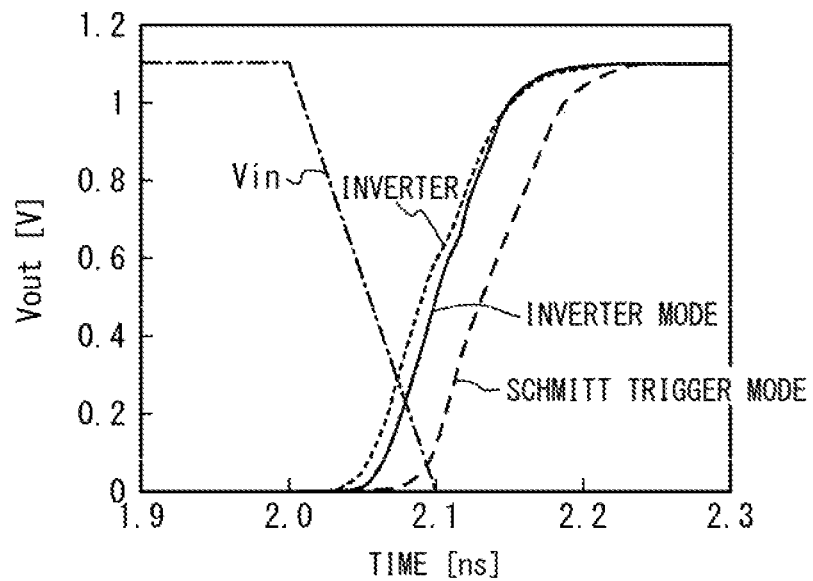

FIG. 4A and FIG. 4B are graphs of output voltage versus time in the first variation of the first embodiment. Chain lines indicate an input voltage Vin, dotted lines indicate an inverter without the FETs 15 and 16, solid lines indicate the inverter mode, and dashed lines indicate the Schmitt trigger mode. FIG. 4A illustrates a case where the input voltage Vin is switched from a low level to a high level, and FIG. 4B illustrates a case where the input voltage Vin is switched from a high level to a low level. As illustrated in FIG. 4A and FIG. 4B, in the Schmitt trigger mode, the output voltage Vout switches more slowly than that of the inverter. In the inverter mode, since the FETs 15 and 16 assist pull-up and pull-down, the output voltage Vout switches as fast as that of the inverter. As described above, the operating speed is slow in the Schmitt trigger mode, while high-speed operation is achievable in the inverter mode.

Figure 5A:
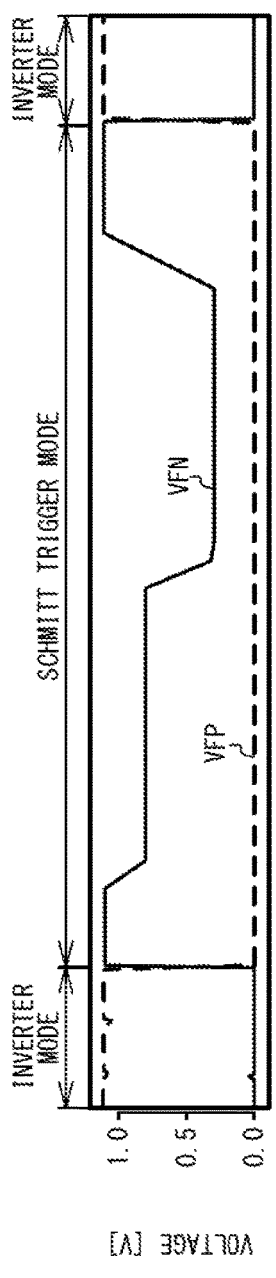
FIG. 5A through FIG. 5E are timing diagrams in the first variation of the first embodiment.
Figure 5B:
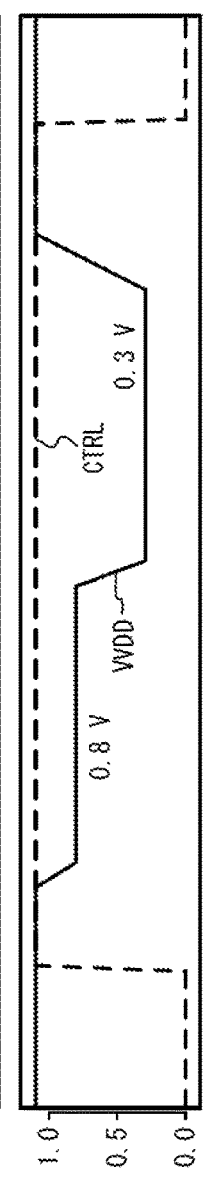
Figure 5C:
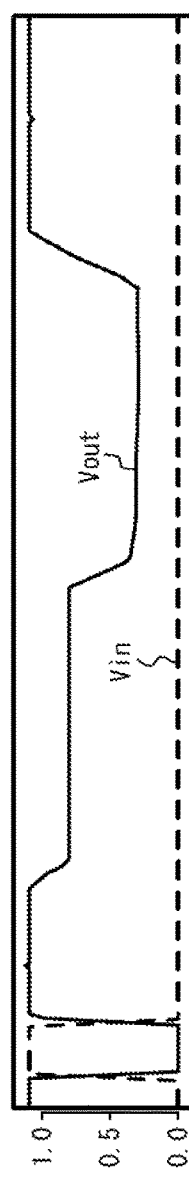
Figure 5D:
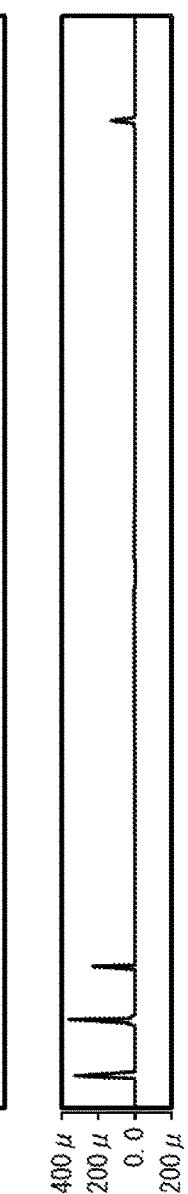
Figure 5E:
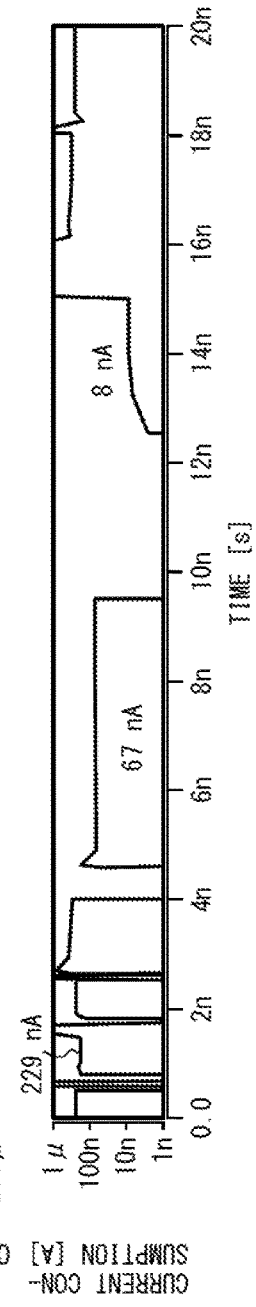

FIG. 5A through FIG. 5E are timing diagrams in the first variation of the first embodiment. FIG. 5A illustrates the voltages VFN and VFP of the control nodes NFN and NFP with respect to time, FIG. 5B illustrates the control signal CTRL and the virtual power-supply voltage VVDD with respect to time, FIG. 5C illustrates the output voltage Vout and the input voltage Vin with respect to time, FIG. 5D illustrates through-current due to switching of the inverter circuits 10 and the inverters 22 and 24 with respect to time, and FIG. 5E illustrates current consumption with respect to time. In FIG. 5E, the transient response when each voltage has switched is not accurate for convenience of the simulation, but the current value after each voltage has stabilized is accurate.

In FIG. 5B, the period during which the control signal CTRL is at a high level corresponds to the Schmitt trigger mode, while the period during which the control signal CTRL is at a low level corresponds to the inverter mode. In the inverter mode, as illustrated in FIG. 5A, the voltage VFP is at a high level, and the voltage VFN is at a low level. As illustrated in FIG. 5C, the output voltage Vout is at a high level when the input voltage Vin is at a low level, while the output voltage Vout is at a low level when the input voltage Vin is at a high level. As illustrated in FIG. 5D, through-current flows when the output of the inverter circuit 10 and the inverters 22 and 24 switches. As illustrated in FIG. 5E, the current consumption is 229 nA.

In the Schmitt trigger mode, as illustrated in FIG. 5B, the virtual power-supply voltage VVDD was sequentially changed from 1.2 V to 0.8 V and 0.3 V. A voltage of 1.2 V corresponds to the virtual power-supply voltage VVDD at which the inverter circuit 10 normally operates. A voltage of 0.8 V corresponds to the virtual power-supply voltage VVDD for operating the inverter in a so-called sleep mode. A voltage of 0.3 V corresponds to the virtual power-supply voltage VVDD at which a typical inverter does not operate. As illustrated in FIG. 5A and FIG. 5C, the voltage VFN and the output voltage Vout decrease with decrease in the virtual power-supply voltage VVDD. As illustrated in FIG. 5E, the current consumption is 67 nA when the virtual power-supply voltage VVDD is 0.8 V, while the current consumption is 8 nA when the virtual power-supply voltage VVDD is 0.3 V. Therefore, the power consumption is reduced by setting the virtual power-supply voltage VVDD low (for example, 0.3V) in the Schmitt trigger mode. For example, high-speed operation is achieved by setting the virtual power-supply voltage VVDD at 1.2 V in the inverter mode, while the power consumption is reduced by setting the virtual power-supply voltage VVDD at 0.3 V in the Schmitt trigger mode. The power consumption when the virtual power-supply voltage VVDD is decreased to 0.3 V in the Schmitt trigger mode is a small percent of the power consumption when the virtual power-supply voltage VVDD is set at 1.2 V in the inverter mode. In addition, the power consumption is reduced compared to the power consumption in the sleep mode of a typical inverter. Furthermore, the low voltage operation is achievable.

In the first embodiment, the inverter circuit 10 is connected between a power-supply line (a positive power source) and a ground line (a negative power source) that are supplied with power-supply voltages, and switches between the Schmitt trigger mode (a first mode) and the inverter mode (a second mode). The control circuit 20 outputs a first signal setting the inverter circuit 10 in the Schmitt trigger mode, and a second signal setting the inverter circuit 10 in the inverter mode. The power-supply circuit 30 supplies a first voltage as the power-supply voltage while the Schmitt trigger mode is set, and a second voltage higher than the first voltage while the inverter mode is set. This configuration allows the inverter circuit 10 to operate in the inverter mode and the Schmitt trigger mode. In the inverter mode, the inverter circuit 10 can operate at high speed. In the Schmitt trigger mode, the inverter circuit 10 has a steep transfer characteristic having hysteresis that allows the inverter circuit 10 to operate even at a low power-supply voltage, and the power consumption is thus reduced. It is only required that the first mode is a mode that exhibits hysteresis in its transfer characteristic and the second mode is a mode that exhibits no hysteresis in its transfer characteristic, and/or that the change of the output voltage with respect to the input voltage of the transfer characteristic in the first mode is steeper than that in the second mode. For example, in the memory circuit, hysteresis is preferably large and steep in the Schmitt trigger mode. In the logic circuit, the transfer characteristic in the Schmitt trigger mode is preferably steeper than that in the inverter mode.

The circuit structure of the inverter circuit 10 is not limited to FIG. 1A or FIG. 1B. It is only required that the inverter circuit 10 is a circuit of which the presence or absence of the hysteresis of the transfer characteristic is switched by the signal from the control circuit 20. For example, it is only required that the FETs 15 and 16 are feedback circuits that respectively feedback the signal of the output node Nout to the FETs 11 and 12 and the FETs 13 and 14 according to the first signal and the second signal input from the control circuit 20. In the inverter circuit 10 having the circuit structures illustrated in FIG. 1A and FIG. 1B, the control circuit 20 switches between the high level and the low level of the voltage and outputs the resultant voltage to the control nodes NFP and NFN of the FETs 15 and 16 as the first signal and the second signal. This configuration allows switching of the presence and absence of the hysteresis in the transfer characteristic of the inverter circuit 10.

The control circuit 20 outputs, as the second signal setting the inverter mode, a high level to the control node NFP of the FET 15 and a low level to the control node NFN of the FET 16. In addition, the control circuit 20 outputs, as the first signal setting the Schmitt trigger mode, a low level to the control node NFP of the FET 15 and a high level to the control node NFN of the FET 16. This configuration allows the FETs 15 and 16 to set the inverter circuit 10 in the inverter mode when the second signal is input to the control nodes NFP and NFN and set the inverter circuit 10 in the Schmitt trigger mode when the first signal is input to the control nodes NFP and NFN.

Furthermore, the control circuit 20 includes the inverter (an inverting circuit) 22 connected between the control node NFP of the FET 15 and the control node NFN of the FET 16. This configuration allows the control circuit 20 to easily invert the voltages of the control nodes NFP and NFN.

In the simulation, the power-supply voltages of the inverters 22 and 24 were set at the virtual power-supply voltage VVDD, but may be set at freely-selected power-supply voltages. The control circuit 20 may generate the first signal and the second signal without using the inverters 22 and 24. For example, the control circuit 20 may be a circuit that combines logical gates such as NAND circuits and/or NOR circuits.

As illustrated in FIG. 5B, the power-supply circuit 30 switches the virtual power-supply voltage VVDD from the second voltage, which is high, to the first voltage, which is low, after the control circuit 20 has output the first signal that sets the inverter circuit 10 in the Schmitt trigger mode. The power-supply circuit 30 switches the virtual power-supply voltage VVDD from the first voltage, which is low, to the second voltage, which is high, before the control circuit 20 outputs the second signal that sets the inverter circuit 10 in the inverter mode. This configuration stably operates the inverter circuit 10 while the virtual power-supply voltage VVDD is set at the first voltage, which is low. For example, in a second embodiment described later, a bistable circuit stably retains data. The transfer characteristic of the inverter mode may be a transfer characteristic with narrow hysteresis. It is only required that there is substantially no hysteresis. For example, it is only required that hysteresis is not purposefully formed unlike the Schmitt trigger mode.

Second Embodiment

Figure 6A:
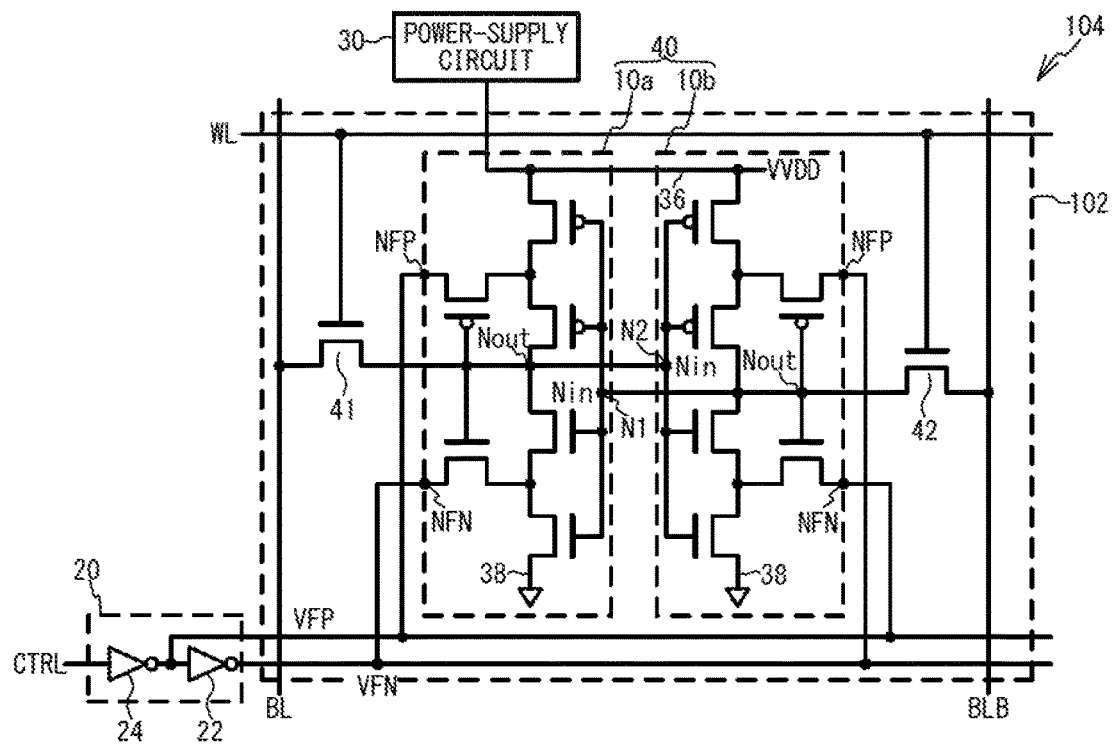
FIG. 6A is a circuit diagram of a memory cell of an electronic circuit in accordance with a second embodiment.
Figure 6B:
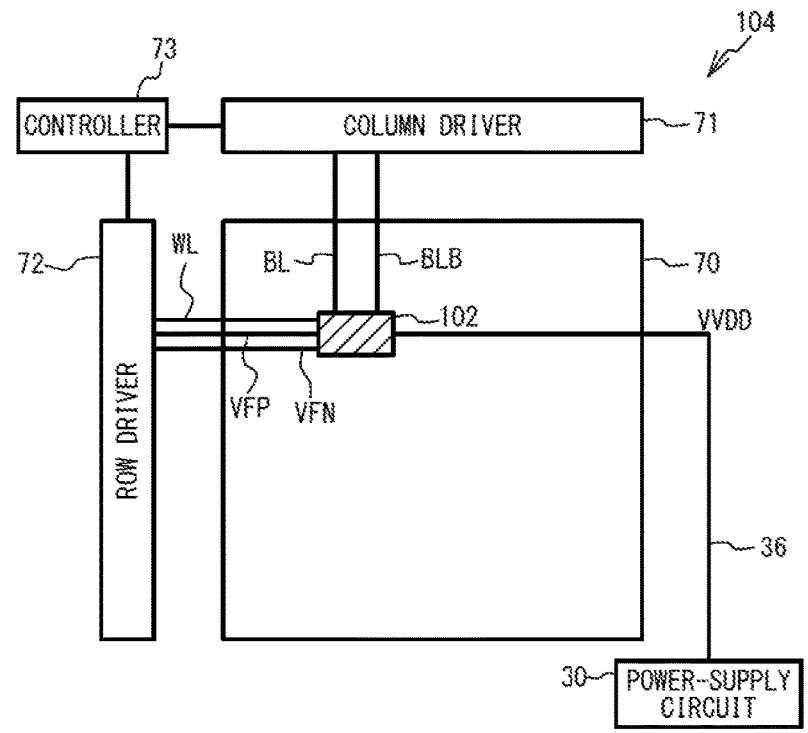
FIG. 6B is a circuit diagram of the electronic circuit.

The second embodiment is an exemplary memory circuit using the inverter circuit of the first embodiment. FIG. 6A is a circuit diagram of a memory cell of an electronic circuit in accordance with the second embodiment, and FIG. 6B is a circuit diagram of the electronic circuit. As illustrated in FIG. 6A, an electronic circuit 104 includes a memory cell 102, the control circuit 20, and the power-supply circuit 30. The memory cell 102 includes inverter circuits 10a and 10b and FETs 41 and 42. Each of the inverter circuits 10a and 10b is the inverter circuit 10 of the first embodiment. The inverter circuits 10a and 10b are coupled in a loop to form a bistable circuit 40. That is, the output node Nout of the inverter circuit 10a is coupled to the input node Nin of the inverter circuit 10b, and the output node Nout of the inverter circuit 10b is coupled to the input node Nin of the inverter circuit 10a. The output nodes Nout of the inverter circuits 10a and 10b respectively correspond to memory nodes N2 and N1. The FETs 41 and 42 are N-channel FETs. One of the source and the drain of the FET 41 is coupled to the memory node N2, the other of the source and the drain is coupled to a bit line BL, and the gate is coupled to a word line WL. One of the source and the drain of the FET 42 is coupled to the memory node N1, the other of the source and the drain is coupled to a bit line BLB, and the gate is coupled to the word line WL.

As illustrated in FIG. 6B, the electronic circuit 104 includes a memory region 70, a column driver 71, a row driver 72, and a controller 73. The memory cells 102 are arranged in a matrix form within the memory region 70. The column driver 71 selects a column according to an address signal, and applies a voltage or the like to the bit lines BL and BLB of the selected column. The row driver 72 selects a row according to an address signal, and applies a voltage to the word line WL of the selected row and the voltages VFP and VFN to the control lines of the selected row. The controller 73 controls the column driver 71 and the row driver 72. For example, the controller 73 uses a read circuit and a write circuit (not illustrated) to write data in and read data from the memory cell 102 selected by the word line WL and the bit lines BL and BLB.

The functions of the control circuit 20 and the power-supply circuit 30 are the same as those of the first embodiment and the variation thereof. The control circuit 20 may be provided with respect to each row or with respect to each memory cell 102. For simplification, the control circuit 20 is preferably provided with respect to each row. The power-supply circuit 30 may be shared by the memory cells 102 within the memory region 70. Alternatively, the memory region 70 may be divided into a plurality of regions, and the power-supply circuit 30 may be provided with respect to each divided region. For example, the power-supply circuit 30 may be provided with respect to each row.

Figure 7A:
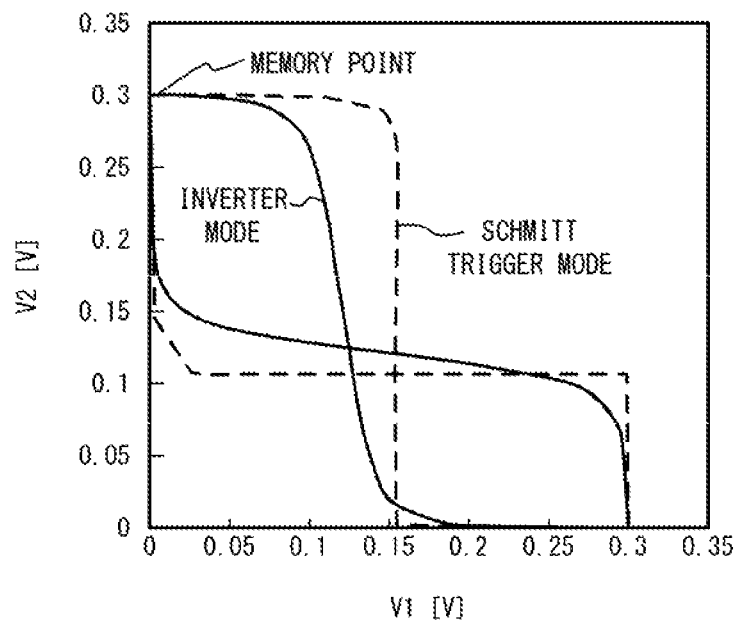
FIG. 7A and FIG. 7B illustrate the characteristics of the memory cell in the second embodiment.
Figure 7B:
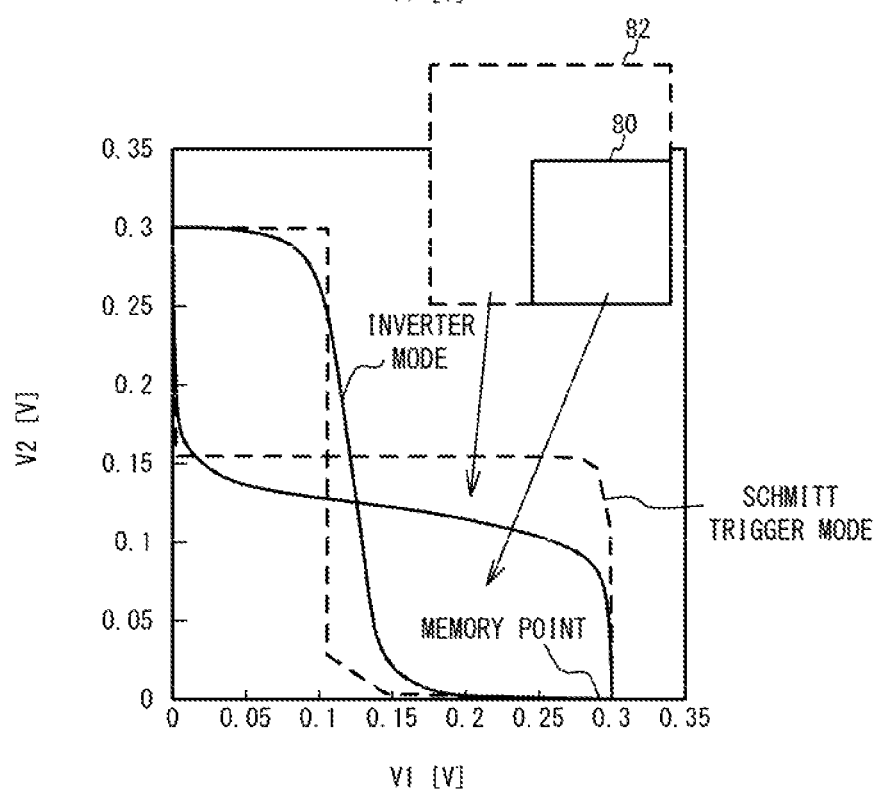

The characteristics of the memory cell 102 were simulated. FIG. 7A and FIG. 7B illustrate the characteristics of the memory cell in the second embodiment, and are graphs of voltage V2 of the memory node N2 versus voltage V1 of the memory node N1. FIG. 7A illustrates a case where the memory node N2 was initially at a memory point (that is, the memory node N2 is at a high level). FIG. 7B illustrates a case where the memory node N1 was initially at a memory point (that is, the memory node N1 is at a high level). The simulation was conducted under the assumption that the virtual power-supply voltage VVDD is 0.3 V.

As illustrated in FIG. 7A and FIG. 7B, in the inverter mode, the characteristics are symmetrical in the memory nodes N1 and N2. On the other hand, in the Schmitt trigger mode, the aperture at the memory point side of the butterfly curves is greater. This is because the transfer characteristic of the inverter circuit 10 has hysteresis in the Schmitt trigger mode as illustrated in FIG. 3. Furthermore, the aperture of the butterfly curves has a shape similar to a square shape. This is because the output voltage Vout rapidly changes with respect to the input voltage Vin as illustrated in FIG. 3. The length of the side of the square that fits in the aperture corresponds to a noise margin. That is, a larger square represents a larger noise margin. The square defined by a solid line 80 represents the noise margin in the inverter mode, and the square defined by a dashed line 82 represents the noise margin in the Schmitt trigger mode in FIG. 7B. In the inverter mode, when the virtual power-supply voltage VVDD is set at 0.3 V, the noise margin is small. Thus, when the virtual power-supply voltage VVDD is set at 0.3 V, the data in the memory nodes N1 and N2 is not stably retained. In the Schmitt trigger mode, even when the virtual power-supply voltage VVDD is set at 0.3 V, the noise margin is two times larger. Thus, even when the virtual power-supply voltage VVDD is set at 0.3 V, the data in the memory nodes N1 and N2 is retained more stably.

Figure 8A:
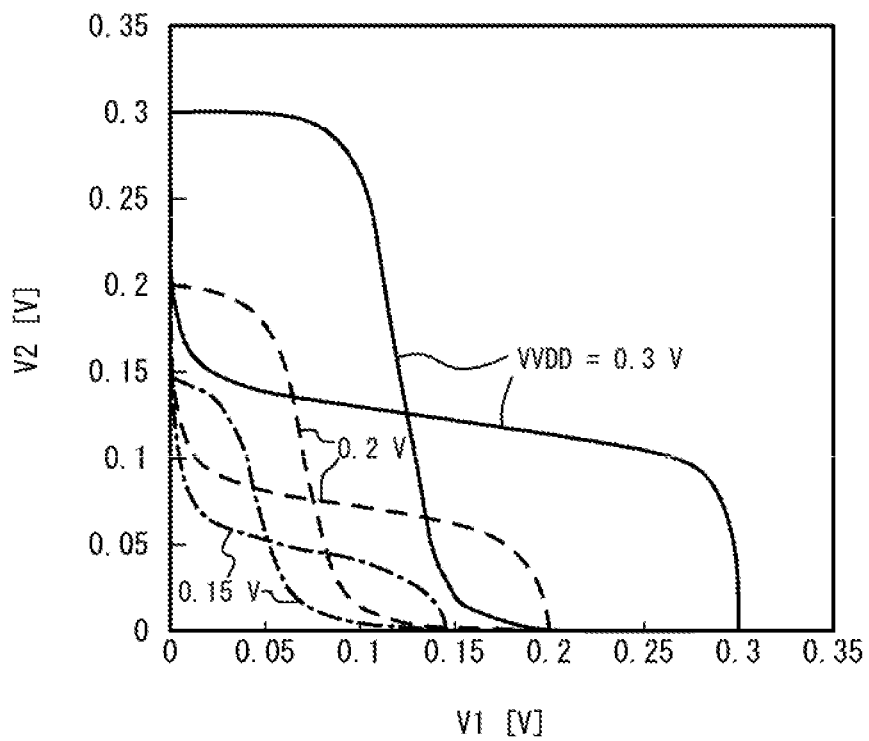
FIG. 8A and FIG. 8B illustrate the characteristics of the memory cell in an inverter mode and a Schmitt trigger mode in the second embodiment, respectively.
Figure 8B:
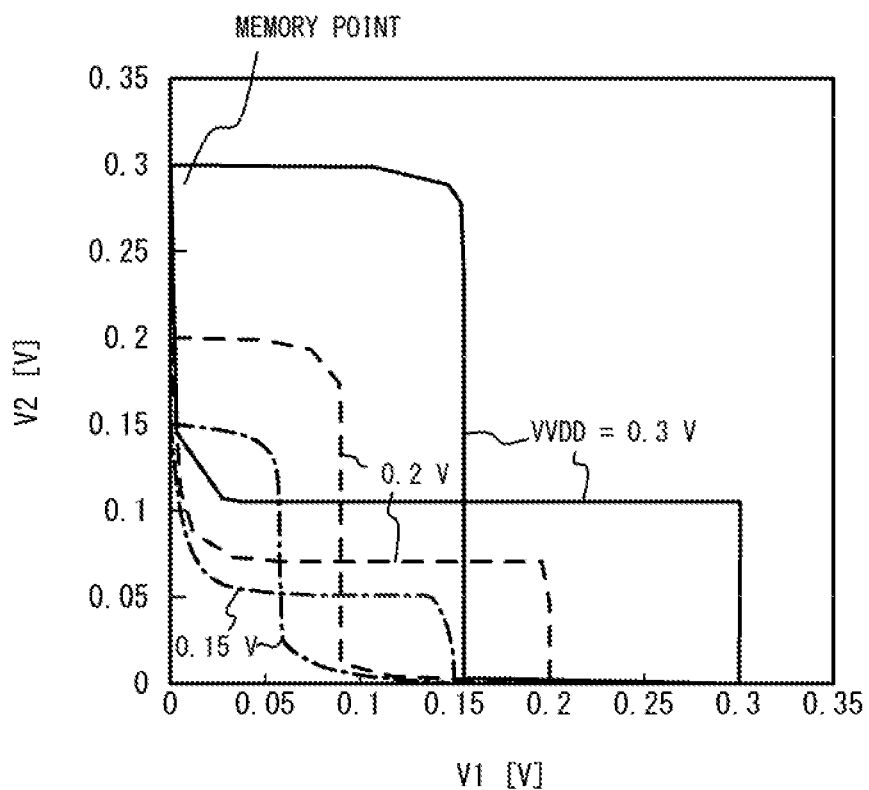

FIG. 8A and FIG. 8B illustrate the characteristics of the memory cell in the inverter mode and the Schmitt trigger mode in the second embodiment, respectively. As illustrated in FIG. 8A, in the inverter mode, as the virtual power-supply voltage VVDD is reduced to 0.3V, 0.2 V, and 0.15 V, the noise margin decreases. As illustrated in FIG. 8B, in the Schmitt trigger mode, the noise margins at the memory point side at 0.3V, 0.2 V, and 0.15 V of the virtual power-supply voltage VVDD are greater than those in the inverter mode. At any virtual power-supply voltage VVDD, the shape of the noise margin is closer to a rectangular shape than that in the inverter mode.

In the second embodiment, the electronic circuit 104 includes the bistable circuit 40 including the inverter circuit 10a (a first inverter) and the inverter circuit 10b (a second inverter) connected in a loop. This structure allows the data in the bistable circuit 40 to be stably retained even when the virtual power-supply voltage VVDD is set low in the Schmitt trigger mode. The retention of data at the low virtual power-supply voltage VVDD reduces the standby power consumption during the data retention. High-speed operation is achievable by setting the virtual power-supply voltage VVDD high in the inverter mode.

Figure 9A:
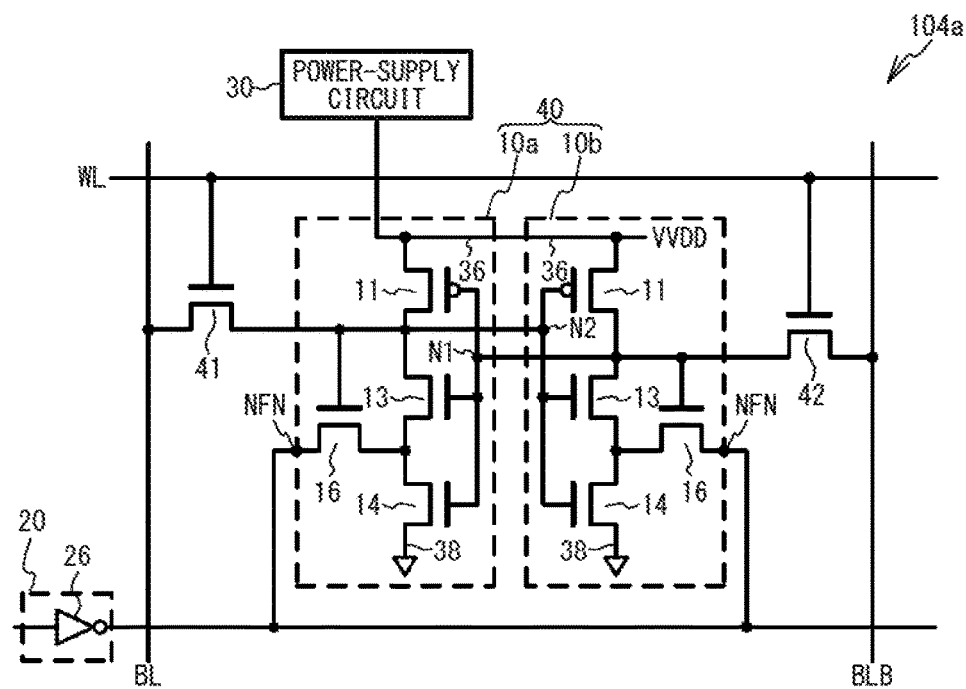
FIG. 9A and FIG. 9B are circuit diagrams of electronic circuits in accordance with first and second variations of the second embodiment, respectively.
Figure 9B:
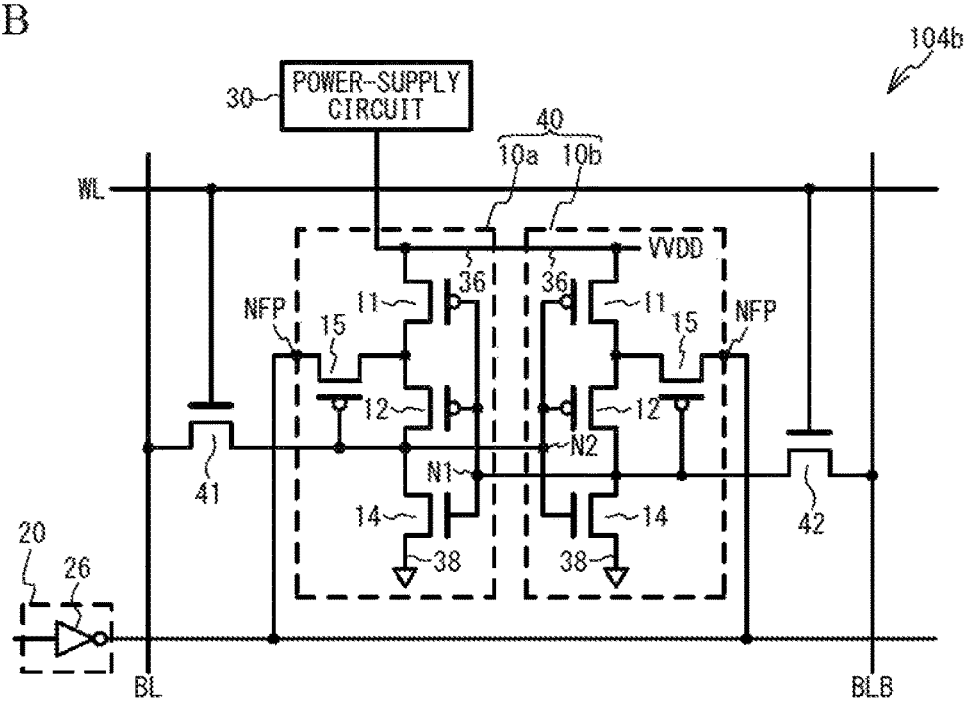

FIG. 9A and FIG. 9B are circuit diagrams of electronic circuits in accordance with first and second variations of the second embodiment, respectively. As illustrated in FIG. 9A, in an electronic circuit 104a, the inverter circuits 10a and 10b do not include the FET 12 or 15. The control circuit 20 includes an inverter 26. The output of the control circuit 20 is coupled to the control nodes NFN of the inverter circuits 10a and 10b. Other structures are the same as those of the second embodiment, and the description thereof is thus omitted. As illustrated in FIG. 9B, in an electronic circuit 104b, the inverter circuits 10a and 10b do not include the FET 13 or 16. The output of the control circuit 20 is coupled to the control nodes NFP of the inverter circuits 10a and 10b. Other structures are the same as those of the second embodiment, and the description thereof is thus omitted. In the first and second variations of the second embodiment, the inverter 26 may be omitted, and the control signal CTRL may be directly input to the control node NFN or NFP.

As in the first and second variations of the second embodiment, one of the P-channel FET and the N-channel FET may be connected in a plurality, and the other may be one. It is only required that the FET 15 or 16 is coupled to only the FET connected in a plurality. As described above, even when the feedback circuit feeds back the Vout to one of the P-channel FET and the N-channel FET, switching between the inverter mode and the Schmitt trigger mode is possible.

Figure 10:
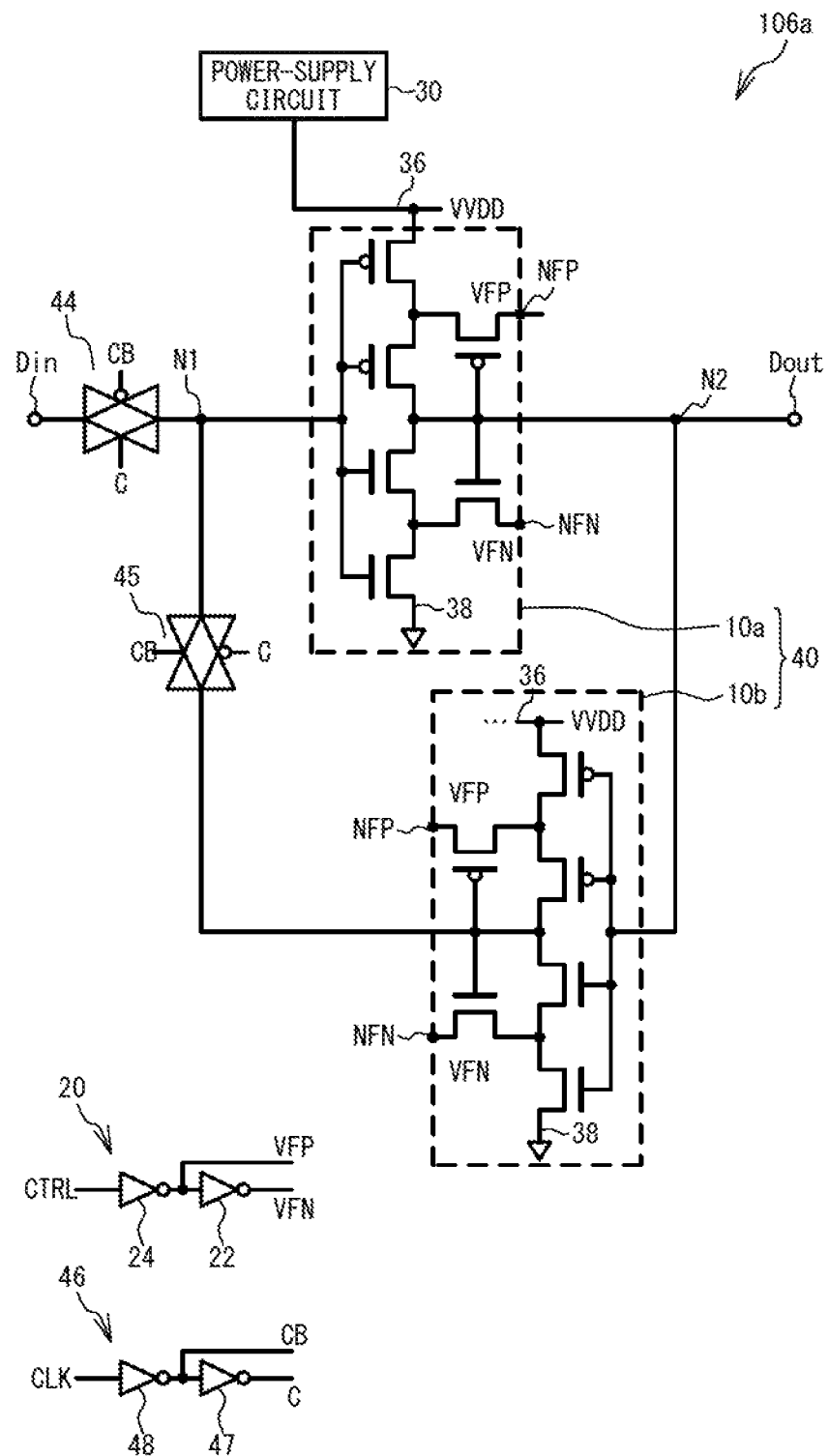
FIG. 10 is a circuit diagram of an electronic circuit in accordance with a third variation of the second embodiment.

Third and fourth variations of the second embodiment are exemplary latch circuits. FIG. 10 is a circuit diagram of an electronic circuit in accordance with the third variation of the second embodiment. As illustrated in FIG. 10, an electronic circuit 106a includes the bistable circuit 40, pass gates 44 and 45, the control circuit 20, the power-supply circuit 30, and a clock supply circuit 46. The bistable circuit 40 includes the inverter circuits 10a and 10b connected in a loop. The pass gate 44 is connected between the memory node N1 of the bistable circuit 40 and an input node Din. The pass gate 45 is connected in the loop. The control circuit 20 respectively applies the voltages VFP and VFN in the control nodes NFP and NFN in the inverter circuits 10a and 10b. The power-supply circuit 30 supplies the virtual power-supply voltage VVDD to the power-supply line 36. The clock supply circuit 46 includes inverters 47 and 48. The clock supply circuit 46 generates from a clock signal CLK clocks C and CB, and supplies the clocks C and CB to the pass gates 44 and 45.

Figure 11:
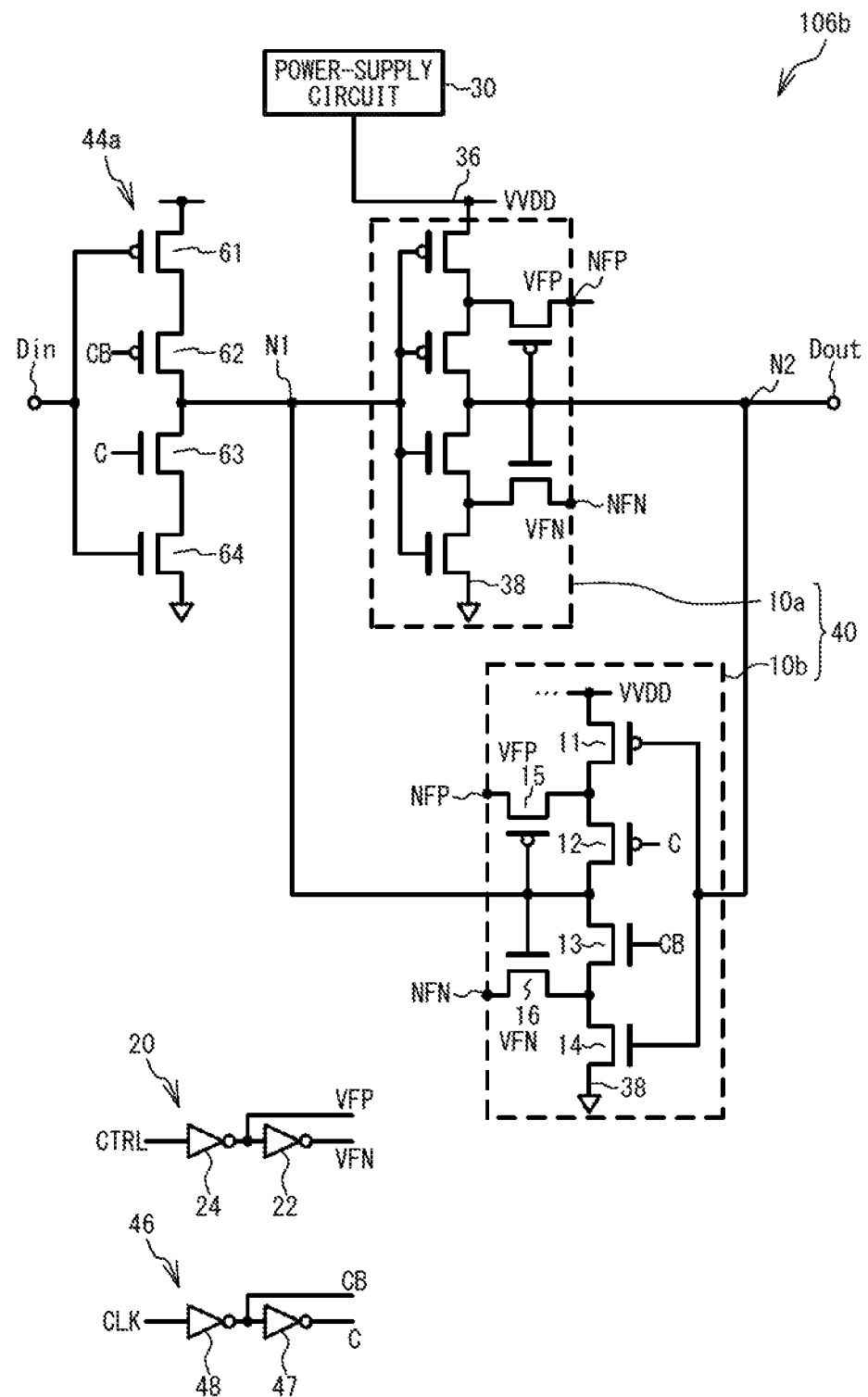
FIG. 11 is a circuit diagram of an electronic circuit in accordance with a fourth variation of the second embodiment.

FIG. 11 is a circuit diagram of an electronic circuit in accordance with the fourth variation of the second embodiment. As illustrated in FIG. 11, in an electronic circuit 106b, the pass gate 44 is replaced by a circuit 44a in which FETs 61 through 64 are connected in series between the power source and a ground. The FETs 61 and 62 are P-channel FETs, and the FETs 63 and 64 are N-channel FETs. The gates of the FETs 61 and 64 are coupled to the input node Din. The clocks CB and C are respectively input to the gates of the FETs 62 and 63. The clocks CB and C may be respectively input to the gates of the FETs 61 and 64 instead of the FETs 62 and 63, and the gates of the FETs 62 and 63 may be coupled to the input node Din. The drains of the FETs 62 and 63 are coupled to the memory node N1. The clocks C and CB are respectively input to the gates of the FETs 12 and 13 of the inverter circuit 10b. The clocks C and CB may be respectively input to the gates of the FETs 11 and 14 instead of the FETs 12 and 13 of the inverter circuit 10b, and the gates of the FETs 12 and 13 may be coupled to the memory node N2. Other structures are the same as those of the third variation of the second embodiment, and the description thereof is thus omitted. As in the third and fourth variations of the second embodiment, the inverter circuit according to any one of the first embodiment and the variations thereof can be adopted to the latch circuit.

Figure 12:
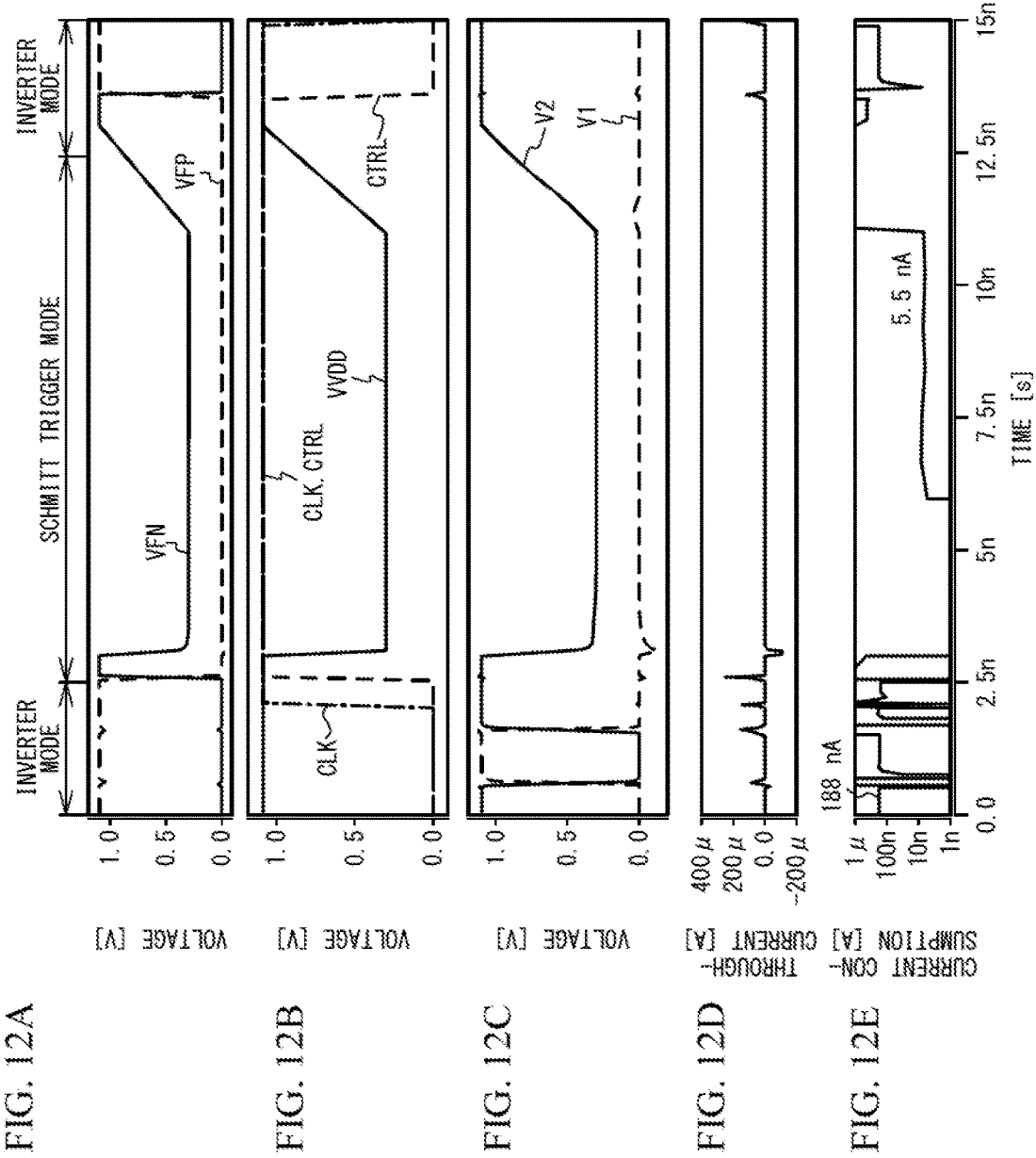
FIG. 12A through FIG. 12E are timing diagrams in the third variation of the second embodiment.

FIG. 12A through FIG. 12E are timing diagrams in the third variation of the second embodiment. FIG. 12A illustrates the voltages VFN and VFP of the control nodes NFN and NFP with respect to time, FIG. 12B illustrates the control signal CTRL, the clock signal CLK, and the virtual power-supply voltage VVDD with respect to time, FIG. 12C illustrates the voltages V1 and V2 of the memory nodes N1 and N2 with respect to time, FIG. 12D illustrates the through-current from the power-supply line 36 to the ground line 38 with respect to time, and FIG. 12E illustrates current consumption with respect to time. In FIG. 12E, the transient response when each voltage has switched is not accurate for convenience of the simulation, but the current values after each voltage has stabilized are accurate.

In the inverter mode, the current consumption is 188 nA as illustrated in FIG. 12E. In the Schmitt trigger mode, as illustrated in FIG. 12B, when the virtual power-supply voltage VVDD is switched from 1.2 V to 0.3 V, the voltage VFN and the voltage V2 become low as illustrated in FIG. 12A and FIG. 12C. As illustrated in FIG. 12E, when the virtual power-supply voltage VVDD is 0.3 V, the current consumption is 5.5 nA. As described above, the power consumption is reduced by setting the Schmitt trigger mode and setting the virtual power-supply voltage VVDD low. The control circuit 20 and the clock supply circuit 46 may be provided with respect to each latch circuit, or each group of a plurality of latch circuits.

Fifth and sixth variations of the second embodiment are exemplary master-slave flip-flop circuits. FIG. 13 is a circuit diagram of an electronic circuit in accordance with the fifth variation of the second embodiment. As illustrated in FIG. 13, an electronic circuit 115 includes latch circuits (D latch circuits) 97 and 98. The latch circuit 97 includes the bistable circuit 40 and the pass gates 44 and 45 that are the same as those of the second embodiment. Signals output from the memory node N1 become QB signals through an inverter 91. Signals output from the memory node N2 become Q signals through an inverter 92. The memory node N1 is coupled to the latch circuit 98 through the pass gate 45.

The latch circuit 98 includes a bistable circuit 90a, and pass gates 95 and 96. In the bistable circuit 90a, typical inverters 99a and 99b incapable of switching modes are connected in a loop. The pass gate 96 is connected in the loop of the bistable circuit 90a. Data D is input to the bistable circuit 90a through an inverter 93 and the pass gate 95. The latch circuits 97 and 98 and the clock supply circuit 46 are coupled to the power-supply line 36 and the ground line 38. The power-supply line 36 is supplied with the virtual power-supply voltage VVDD or the power-supply voltage VDD, while the ground line 38 is supplied with the virtual ground voltage VGND or a ground voltage GND. The control circuit 20 is supplied with voltages VA and VB. The VA is, for example, the virtual power-supply voltage VVDD or the power-supply voltage VDD, while the VB is, for example, the virtual ground voltage VGND or the ground voltage GND. The VA and the VB may be other two voltages or other three voltages.

As in the fifth variation of the second embodiment, the latch circuit according to the third or fourth variation of the second embodiment can be adopted to the latch circuit 97 that is a master-slave flip-flop circuit. Accordingly, by setting the inverter circuits 10a and 10b in the Schmitt trigger mode, the data in the latch circuit 97 is retained even when the voltage supplied between the power-supply line 36 and the ground line 38 is set low. To retain data, it is only required that the latch circuit 97 retains the data. Thus, the inverters 99a and 99b of the latch circuit 98 may be typical inverter circuits that do not operate in the Schmitt trigger mode.

Figure 14:
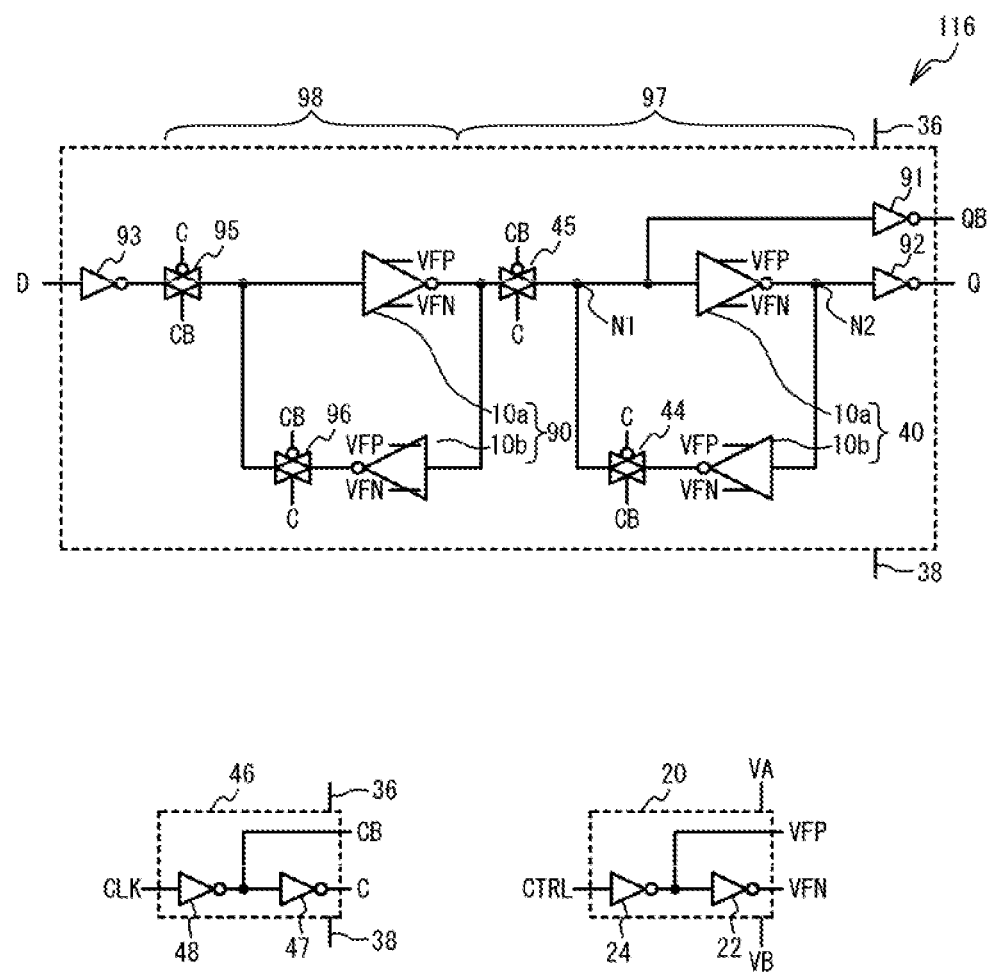
FIG. 14 is a circuit diagram of an electronic circuit in accordance with a sixth variation of the second embodiment.

FIG. 14 is a circuit diagram of an electronic circuit in accordance with a sixth variation of the second embodiment. As illustrated in FIG. 14, in an electronic circuit 116, each of the inverter circuits 10a and 10b used in a bistable circuit 90 of the latch circuit 98 is the inverter circuit according to any one of the first embodiment and the variations thereof. Other structures are the same as those of the fifth variation of the second embodiment, and the description thereof is thus omitted.

In the sixth variation of the second embodiment, all the inverter circuits 10a and 10b of the bistable circuits 40 and 90 of the latch circuits 97 and 98 are the inverter circuits according to any one of the first embodiment and the variations thereof. Accordingly, the electronic circuit 116 stably operates at a low voltage in the Schmitt trigger mode as described later in a fifth embodiment.

Figure 15A:
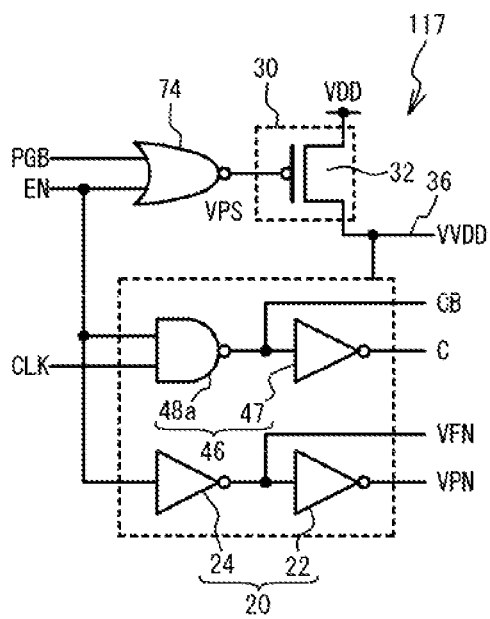
FIG. 15A and FIG. 15B are circuit diagrams of control circuits of the fifth variation of the second embodiment.
Figure 15B:
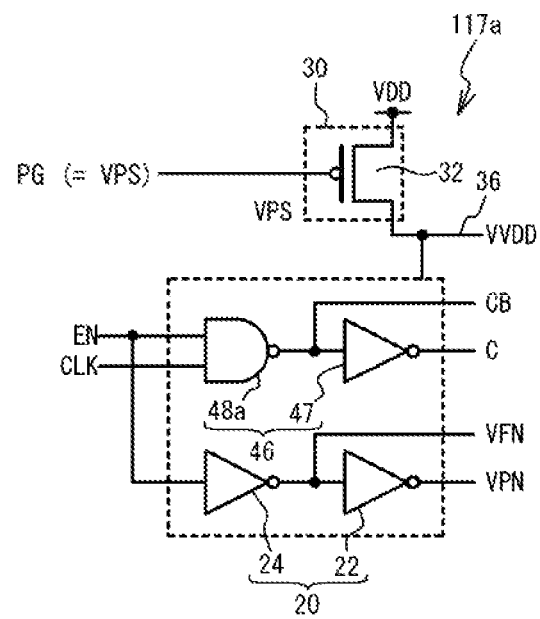
Figure 15C:
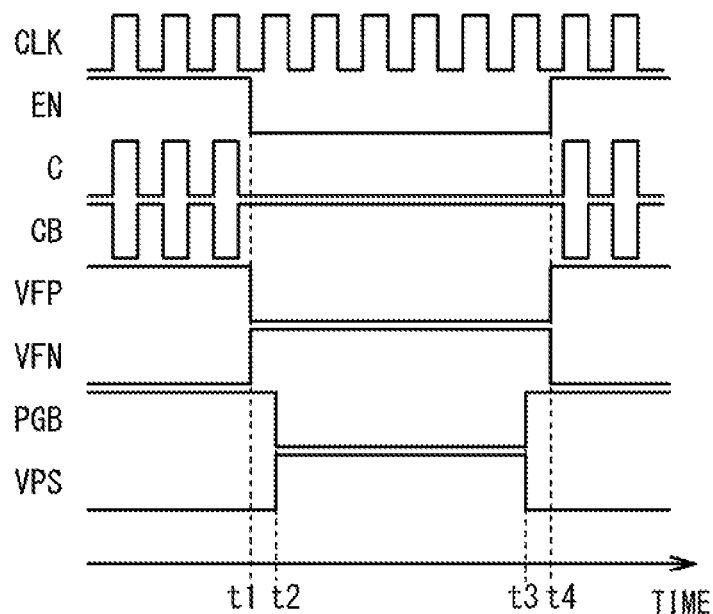
FIG. 15C is a timing diagram.

A description will be given of a case where the control signal CTRL is synchronized with the clock signal CLK in the fifth variation of the second embodiment. FIG. 15A and FIG. 15B are circuit diagrams illustrating control circuits of the fifth variation of the second embodiment, and FIG. 15C is a timing diagram. As illustrated in FIG. 15A, a control circuit 117 includes the power-supply circuit 30, the clock supply circuit 46, and the control circuit 20. A power switch 32 described in later in a third embodiment is used as the power-supply circuit 30. The power switch 32 is a P-channel FET, and is connected between the power-supply line 36 with the virtual power-supply voltage VVDD and the power source with the power-supply voltage VDD. The virtual power-supply voltage VVDD is coupled to the clock supply circuit 46 and the control circuit 20. An enable signal EN and a power gating complementary signal PGB are input to a NOR circuit 74, and the output of the NOR circuit 74 becomes a power switch control signal VPS. The clock supply circuit 46 includes a NAND circuit 48a, and the enable signal EN and the clock signal CLK are input to the NAND circuit 48a. The enable signal EN is input to the inverter 24 of the control circuit 20. Other structures of the control circuit 20 and the clock supply circuit 46 are the same as those of the second embodiment, and the description thereof is thus omitted.

As illustrated in FIG. 15B, a control circuit 117a does not include the NOR circuit 74. The power gating signal PG is input to the gate of the power switch 32 as the power switch control signal VPS. The enable signal EN is input to the NAND circuit 48a and the inverter 24. Other structures are the same as those illustrated in FIG. 15A, and the description thereof is thus omitted.

As illustrated in FIG. 15C, while the enable signal EN and the power gating complementary signal PGB are at a high level (or while the power switch control signal VPS is at a low level), the clock supply circuit 46 supplies the clocks C and CB, and the control circuit 20 outputs a signal setting the inverter mode (i.e., the voltage VFP of high level and the voltage VFN of low level). The power switch 32 is on, and the virtual power-supply voltage VVDD is at a high voltage.

At time t1, the enable signal EN becomes at a low level. The clock supply circuit 46 stops supplying the clocks C and CB. The control circuit 20 outputs a signal setting the Schmitt trigger mode (i.e., the voltage VFP of low level and the voltage VFN of high level). This process sets the inverter circuits 10a and 10b of the bistable circuit 40 in the Schmitt trigger mode. At time t2, the power gating complementary signal PGB becomes at a low level (or the power switch control signal VPS becomes at a high level). Accordingly, the power switch 32 is turned off, and a low voltage is supplied as the virtual power-supply voltage VVDD. The latch circuit 97 retains data at a low voltage.

At time t3, the power gating complementary signal PGB becomes at a high level (or the power switch control signal VPS becomes at a low level). Accordingly, the power switch 32 turns on, and the virtual power-supply voltage VVDD becomes a high voltage. At time t4, the enable signal EN becomes at a high level. The clock supply circuit 46 starts supplying the clocks C and CB. The control circuit 20 supplies a signal setting the inverter mode (the voltages VFP and VFN).

Figure 16A:
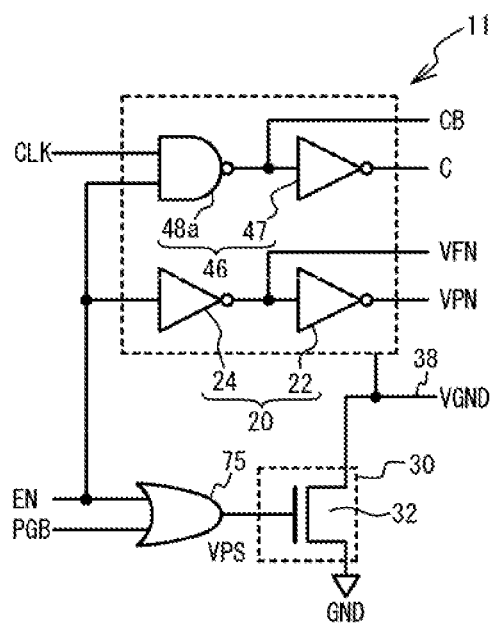
FIG. 16A and FIG. 16B are alternative circuit diagrams of the control circuits of the fifth variation of the second embodiment.
Figure 16B:
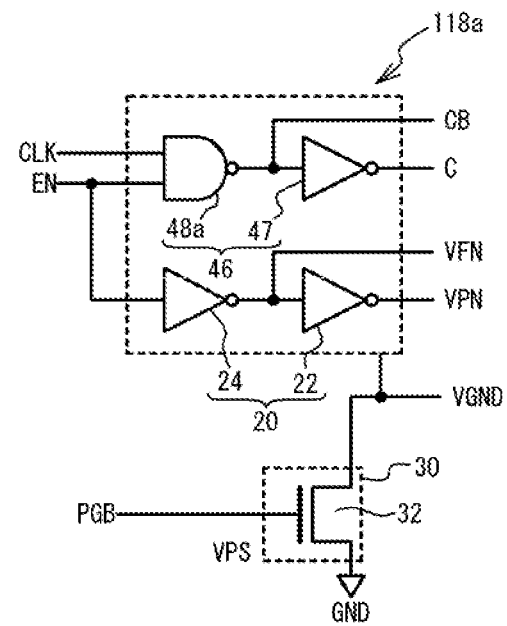
Figure 16C:
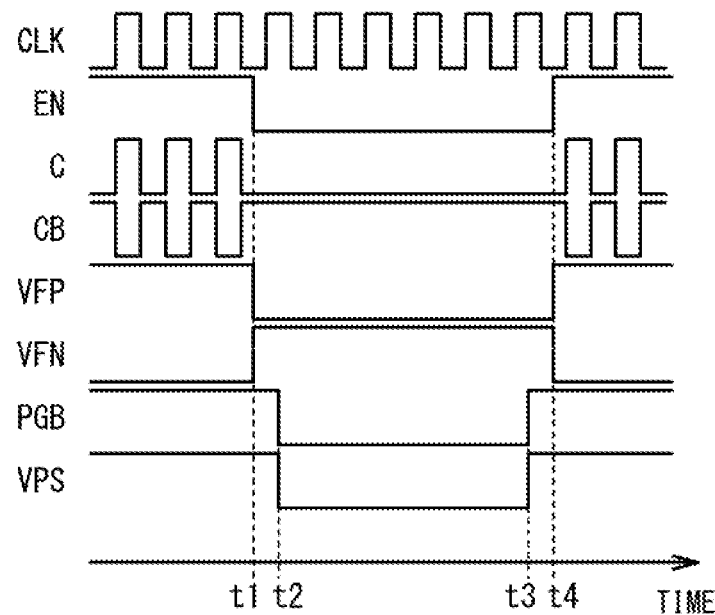
FIG. 16C is a timing diagram.

FIG. 16A and FIG. 16B are alternative circuit diagrams of the control circuits of the fifth variation of the second embodiment, and FIG. 16C is a timing diagram. As illustrated in FIG. 16A, in a control circuit 118, the power switch 32 is an N-channel FET, and is connected between the ground line 38 and the ground voltage GND. Instead of the NOR circuit 74, an OR circuit 75 is provided. Other structures are the same as those illustrated in FIG. 15A, and the description thereof is thus omitted.

As illustrated in FIG. 16B, a control circuit 118a does not include the OR circuit 75. The power gating complementary signal PGB is input to the power switch 32 as the power switch control signal VPS. The enable signal EN is input to the NAND circuit 48a and the inverter 24. Other structures are the same as those illustrated in FIG. 16A, and the description thereof is thus omitted.

As illustrated in FIG. 16C, when the power gating complementary signal PGB is at a high level, the power switch control signal VPS is at a high level. When the power gating complementary signal PGB is at a low level, the power switch control signal VPS is at a low level. Other operations are the same as those illustrated in FIG. 15C, and the description thereof is thus omitted.

As illustrated in FIG. 13 and FIG. 14, the pass gate 45 (a switch) that turns on and off in synchronization with the clocks C and CB is located in the loop formed by the inverter circuits 10a and 10b. As illustrated in FIG. 15A through FIG. 16C, the clock supply circuit 46 supplies the clocks C and CB to the pass gates 44 and 45 while the inverter circuits 10a and 10b are in the inverter mode, and does not supply the clock C or CB to the pass gate 44 or 45 while the inverter circuits 10a and 10b are in the Schmitt trigger mode. As described above, the supply of the clocks C and CB of the clock supply circuit 46 may be synchronized with the supply of the control signal (the voltages VFP and VFN) of the control circuit 20.

In addition, in the Schmitt trigger mode, the clock supply circuit 46 stops supplying the clocks C and CB (clock gating), and the power-supply circuit 30 sets the virtual power-supply voltage VVDD low or the virtual ground voltage VGND high. This configuration reduces leak current. As described above, in the memory circuit, when clock gating is executed, the Schmitt trigger mode is set and power gating is executed. This configuration reduces both the dynamic power and the static power.

As described above, the power-supply circuit 30 supplies a first voltage as the power-supply voltage while the clock supply circuit 46 is not supplying a clock signal, and supplies a second voltage higher than the first voltage as the power-supply voltage while the clock supply circuit 46 is supplying a clock signal. As described above, in the memory circuit, clock gating and power gating are simultaneously executed. Such an operation is achieved by forming the bistable circuit 40 with use of the inverter circuit configured to have the Schmitt trigger mode and the inverter mode. Clock gating and power gating may be simultaneously executed by providing a non-volatile memory element that stores the data of the bistable circuit in the memory cell. The fifth variation of the second embodiment does not use a non-volatile memory element, and thus, can operate at higher speed than a case where a non-volatile memory element is used. Furthermore, the fifth variation of the second embodiment dose not store data in a non-volatile memory element at the time of power shut off. Thus, the energy consumption associated with data storing is small. Accordingly, the energy consumption is efficiently reduced by executing power gating frequently. It should be noticed that simultaneous execution of both clock gating and power gating has been impossible in the memory circuit by only using the CMOS technology without using a non-volatile memory element. Simultaneous execution of both clock gating and power gating has become possible only with the first and second embodiments and the variations thereof.

Third Embodiment

Figure 17A:
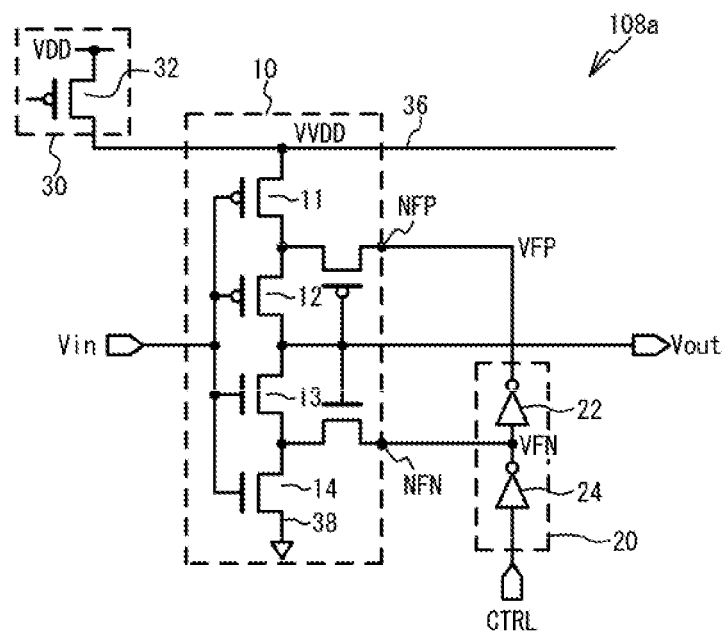
FIG. 17A and FIG. 17B are circuit diagrams of an electronic circuit in accordance with a third embodiment.
Figure 17B:
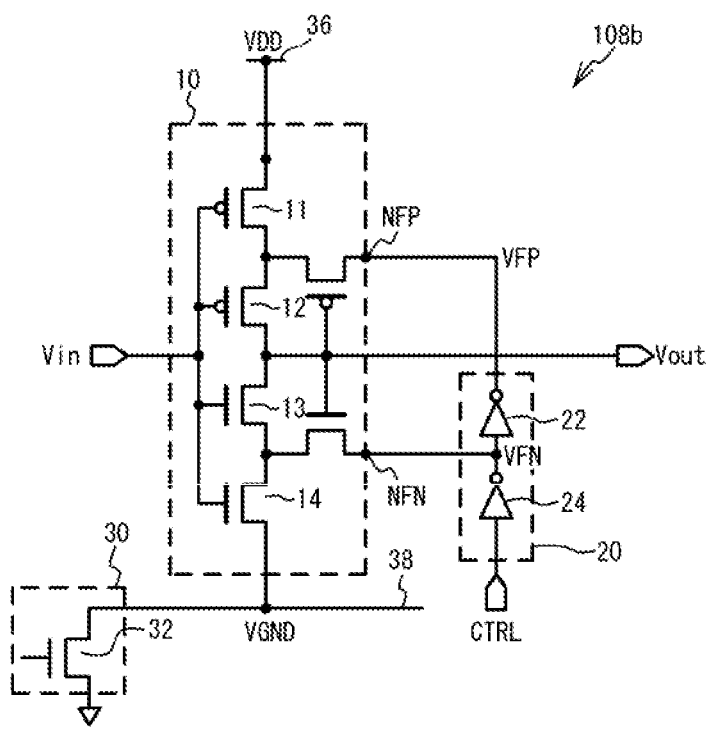

The third embodiment uses a power switch as the power-supply circuit 30. FIG. 17A and FIG. 17B are circuit diagrams of an electronic circuit in accordance with the third embodiment. As illustrated in FIG. 17A, an electronic circuit 108a includes the power switch 32 as the power-supply circuit 30. The power switch 32 is a P-channel FET. The source of the power switch 32 is coupled to the power source with the power-supply voltage VDD, and the drain of the power switch 32 is coupled to the power-supply line 36. The power source with the power-supply voltage VDD is, for example, a power source supplied to the integrated circuit. The power switch 32 switches the voltage of the virtual power-supply voltage VVDD according to the power source signal input to its gate. By turning the power switch 32 on or off, the division ratio of the power switch 32 and the inverter circuit changes. When the power switch 32 is on, the virtual power-supply voltage VVDD is close to the power-supply voltage VDD. When the power switch 32 is off, the virtual power-supply voltage VVDD is significantly lower than the power-supply voltage VDD. At this time, the voltage applied to the inverter circuit 10 is, for example, a voltage at which data is retained in the Schmitt trigger mode in the memory circuit, and a voltage at which stable operation is achieved in the Schmitt trigger mode in the logic circuit. Other structures are the same as those of the first embodiment illustrated in FIG. 2B, and the description thereof is thus omitted.

As illustrated in FIG. 17B, in an electronic circuit 108b, the power-supply circuit 30 is the power switch 32 coupled at a ground side. The power switch 32 is an N-channel FET. The source of the power switch 32 is coupled to a ground, and the drain is coupled to the ground line 38. The ground is, for example, a ground provided to the integrated circuit. The power switch 32 switches the voltage of the virtual ground voltage VGND according to the power source signal input to its gate. Turning the power switch 32 on or off changes the division ratio of the power switch 32 and the inverter circuit. When the power switch 32 is on, the virtual ground voltage VGND is close to the ground voltage. When the power switch 32 is off, the virtual ground voltage VGND is significantly higher than the ground voltage. In this case, the voltage applied to the inverter circuit 10 is, for example, a voltage at which data is retained in the Schmitt trigger mode in the memory circuit, and a voltage at which stable operation is achieved in the Schmitt trigger mode in the logic circuit. Other structures are the same as those illustrated in FIG. 17A, and the description thereof is thus omitted.

Figure 18:
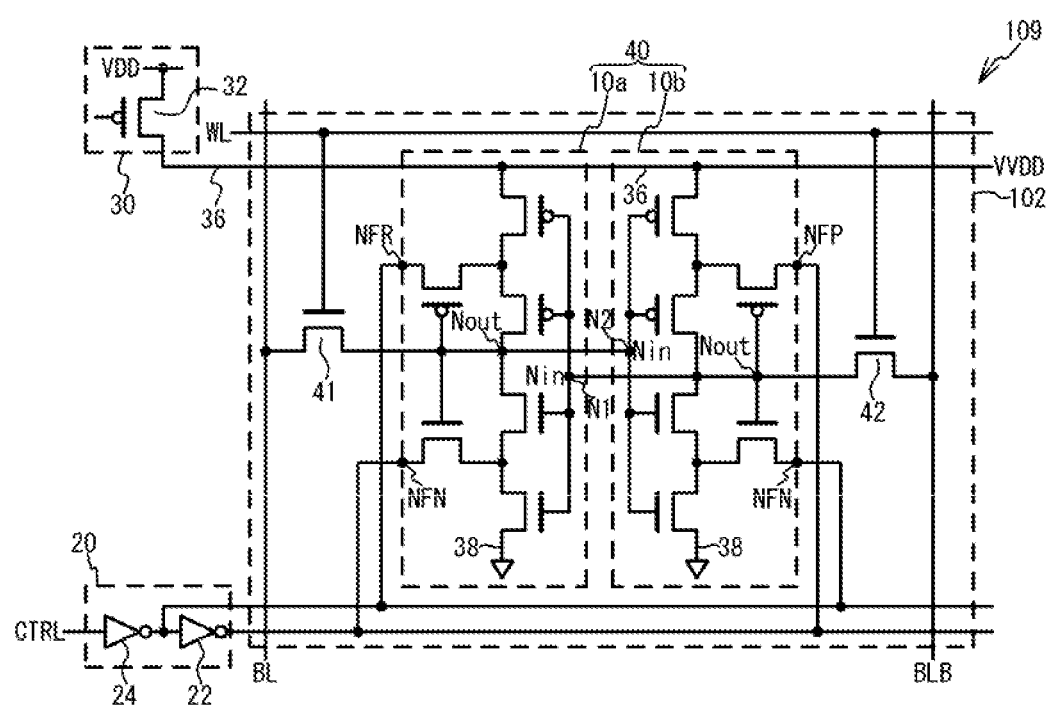
FIG. 18 is a circuit diagram of an electronic circuit in accordance with a first variation of the third embodiment.

FIG. 18 is a circuit diagram of an electronic circuit in accordance with a first variation of the third embodiment. As illustrated in FIG. 18, in an electronic circuit 109, the power switch 32 is provided as the power-supply circuit 30. Other structures are the same as those of the second embodiment illustrated in FIG. 6A, and the description thereof is thus omitted. As in the third embodiment and the first variation thereof, the power-supply circuit 30 may be the power switch 32. The data in the memory circuit is retained even when the power switch 32 is turned off by setting the virtual power-supply voltage VVDD at the voltage at which the data is retained when the power switch 32 is turned off (for example, by designing the size of the power switch 32 so that such a virtual power-supply voltage VVDD is obtained at the time of shut off). The power switch 32 may be only located at the ground line 38 side, or may be located at both the power-supply line 36 side and the ground line 38 side.

A diode may be connected between the source and the drain of the power switch 32 to generate the virtual power-supply voltage VVDD or the virtual ground voltage VGND when the power switch 32 is turned off. The diode may be formed of a transistor such as a MOSFET. Furthermore, a current source may be connected between the source and the drain of the power switch 32 to generate the virtual power-supply voltage VVDD and the virtual ground voltage VGND when the power switch 32 is turned off. The current source may be formed with use of a transistor such as a MOSFET. Furthermore, desired virtual power-supply voltage VVDD or desired virtual ground voltage VGND may be generated by setting a signal applied to the gate of the power switch 32 at a voltage between a high level and a low level.

Fourth Embodiment

Figure 19A:
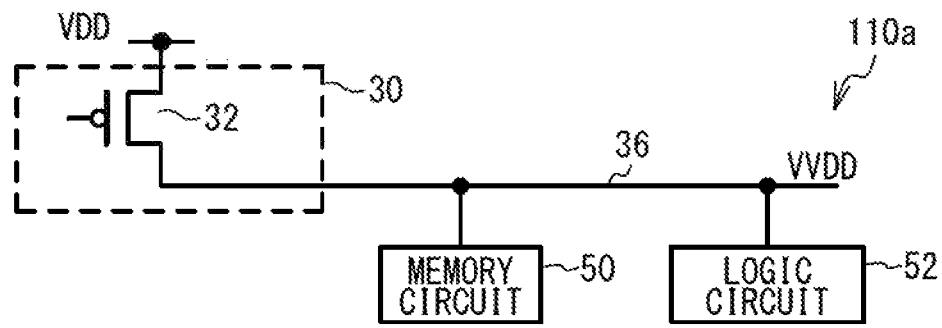
FIG. 19A through FIG. 19C are circuit diagrams of electronic circuits in accordance with a fourth embodiment, a first variation of the fourth embodiment, and a second variation of the fourth embodiment, respectively.
Figure 19B:
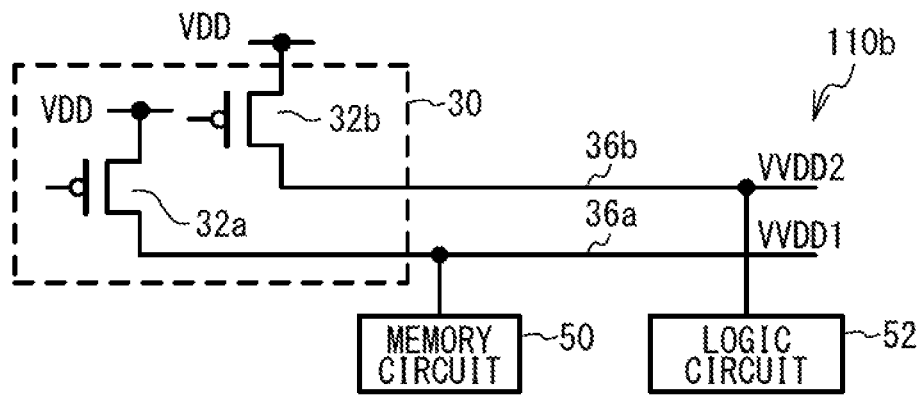
Figure 19C:
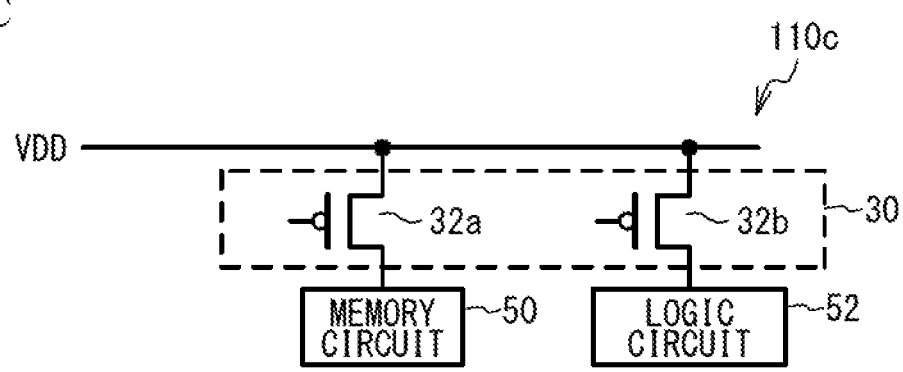

A fourth embodiment is an exemplary electronic circuit including a memory circuit and a logic circuit. FIG. 19A through FIG. 19C are circuit diagrams of electronic circuits in accordance with the fourth embodiment, a first variation of the fourth embodiment, and a second variation of the fourth embodiment, respectively. As illustrated in FIG. 19A, an electronic circuit 110a includes a memory circuit 50 and a logic circuit 52. The memory circuit 50 is, for example, a cash memory or a register, and includes the SRAM memory circuit of the second embodiment or a flip-flop including the latch circuit according to any one of the second and third variations of the second embodiment. The memory circuit 50 and the logic circuit 52 are supplied with the virtual power-supply voltage VVDD from the power-supply line 36. The power-supply circuit 30 includes the power switch 32. The power switch 32 switches the virtual power-supply voltage VVDD or shuts off the power-supply voltage. The power switch 32 is designed so that the power switch 32 supplies the virtual power-supply voltage VVDD of a low voltage at which the memory circuit 50 can stably retain data in the Schmitt trigger mode. In addition, the logic circuit of the fifth embodiment described later may be mounted in the logic circuit 52. This structure allows the logic circuit 52 to stably operate at a low voltage in the Schmitt trigger mode.

The following three cases are considered as the combination of the memory circuit 50 and the logic circuit 52. The first one is a case where the memory circuit 50 is capable of switching between the Schmitt trigger mode and the inverter mode and the logic circuit 52 is a typical logic circuit incapable of switching the modes. The second one is a case where the memory circuit 50 is a typical memory circuit incapable of switching the modes, and the logic circuit 52 is a logic circuit capable of switching the modes. The third one is a case where both the memory circuit 50 and the logic circuit 52 are circuits capable of switching the modes. In any case, the design of the virtual power-supply voltage VVDD is important in the circuit capable of switching the modes. The memory circuit 50 and the logic circuit 52 may include a plurality of blocks. Furthermore, the memory circuit 50 may include a peripheral circuit.

The fourth embodiment provides the power switch 32 that commonly supplies the virtual power-supply voltage VVDD to the memory circuit 50 and the logic circuit 52. This structure reduces the number of the power switches 32, thus reducing the size. For example, the occupation area of the power switches 32 is reduced.

As illustrated in FIG. 19B, in an electronic circuit 110b, the memory circuit 50 is supplied with a virtual power-supply voltage VVDD1 from a power-supply line 36a, and the logic circuit 52 is supplied with a virtual power-supply voltage VVDD2 from a power-supply line 36b. The power-supply circuit 30 includes power switches 32a and 32b. The power switch 32a switches the virtual power-supply voltage VVDD1 or shuts off the power-supply voltage, and the power switch 32b switches the virtual power-supply voltage VVDD2 or shuts off the power-supply voltage. The memory circuit 50 and the logic circuit 52 may include a plurality of blocks. Furthermore, the memory circuit 50 may include a peripheral circuit. Other structures are the same as those of the fourth embodiment, and the description thereof is thus omitted.

The first variation of the fourth embodiment includes the power switches 32a and the 32b that individually supply the virtual power-supply voltages VVDD1 and VVDD2 to the memory circuit 50 and the logic circuit 52, respectively. This structure allows the virtual power-supply voltages of the memory circuit 50 and the logic circuit 52 to be different voltages at different times.

As illustrated in FIG. 19C, in an electronic circuit 110c, the power switch 32a supplies the virtual power-supply voltage VVDD1 from the power source of the power-supply voltage VDD to the memory circuit 50, while the power switch 32b supplies the virtual power-supply voltage VVDD2 from the power source of the power-supply voltage VDD to the logic circuit 52. The memory circuit 50 and the logic circuit 52 may include a plurality of blocks. Furthermore, the memory circuit 50 may include a peripheral circuit. Other structures are the same as those of the first variation of the fourth embodiment, and the description thereof is thus omitted.

In the second variation of the fourth embodiment, since the power-supply lines 36a and 36b are omitted, the layout is simplified and the occupation area is reduced.

In the fourth embodiment and the variations thereof, when the memory circuit 50 includes a circuit capable of switching between the Schmitt trigger mode and the inverter mode, the power switch is designed so that the power switch supplies the virtual power-supply voltage VVDD that allows the data to be retained. When the logic circuit 52 includes a circuit capable of switching between the Schmitt trigger mode and the inverter mode, the power switch is designed so that the power switch supplies the virtual power-supply voltage VVDD that allows stable low voltage operation. In addition, the power switch may be composed of one transistor or a plurality of transistors.

In the fourth embodiment and the variations thereof, the same structures illustrated in FIG. 19A through FIG. 19C can be adapted to the case where the power-supply circuit 30 is located at the ground side. That is, the memory circuit 50 and the logic circuit 52 may be commonly coupled to the ground line, and the power switch 32 may be located between the ground line and a ground. Alternatively, each of the memory circuit 50 and the logic circuit 52 may be coupled to a ground line, and the power switch 32 may be located between each ground line and a ground. Alternatively, the ground line may not be necessarily provided, and the power switches 32 may be located between the memory circuit 50 and a ground and between the logic circuit 52 and a ground. Alternatively, the power switches 32 may be located at both the power source side and the ground side.

Fifth Embodiment

Figure 20:
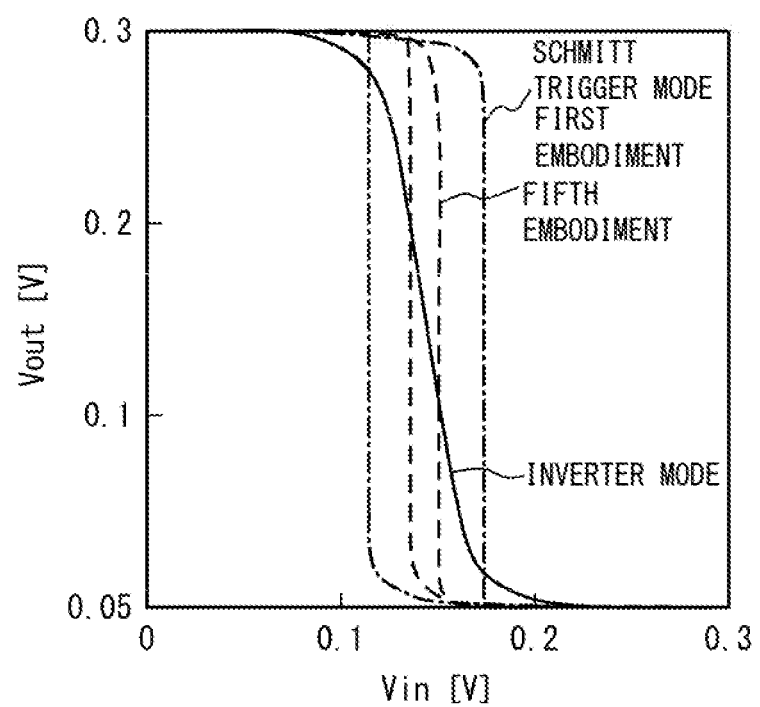
FIG. 20 illustrates the transfer characteristic of the inverter circuit in a fifth embodiment.

A description will be given of operation with low power consumption (or at the voltage that minimizes the energy consumption) in the Schmitt trigger mode. FIG. 20 illustrates the transfer characteristic of the inverter circuit in the fifth embodiment. As illustrated in FIG. 20, in the fifth embodiment, the hysteresis in the Schmitt trigger mode is made to be smaller than that in the first embodiment. For example, the magnitude of the hysteresis can be changed by the settings of the FETs 15 and 16 and/or the settings of the voltages VFP and VFN.

In the logic circuit, the hysteresis in the Schmitt trigger mode may be made to be small. Even when the hysteresis is small, if the voltage changes rapidly, the noise margin increases, and thus, the variation tolerance and the noise tolerance improve. Thus, the operation at a low power-supply voltage is achievable. Therefore, the power consumption is reduced by setting the virtual power-supply voltage VVDD low in the Schmitt trigger mode. For example, the virtual power-supply voltage VVDD can be set at a voltage near the voltage at which the energy efficiency of the operation has the minimum value. In the inverter mode, high-speed operation is achievable by setting the virtual power-supply voltage VVDD high.

Also in the memory circuit, in the Schmitt trigger mode, the hysteresis is made to be smaller than that in the first embodiment, and the virtual power-supply voltage VVDD is set lower than that in the inverter mode. This configuration allows the operation with low power consumption although the operating speed is slower than that in the inverter mode. The virtual power-supply voltage VVDD may be higher than the virtual power-supply voltage VVDD in the Schmitt trigger mode of the first embodiment.

For example, the fifth embodiment can be adopted to the memory cell in the memory circuit 50 and/or the logic circuit in the logic circuit 52 of the fourth embodiment and the variations thereof. A description will be given of the logic circuit by using a NAND circuit as an example.

Figure 21:
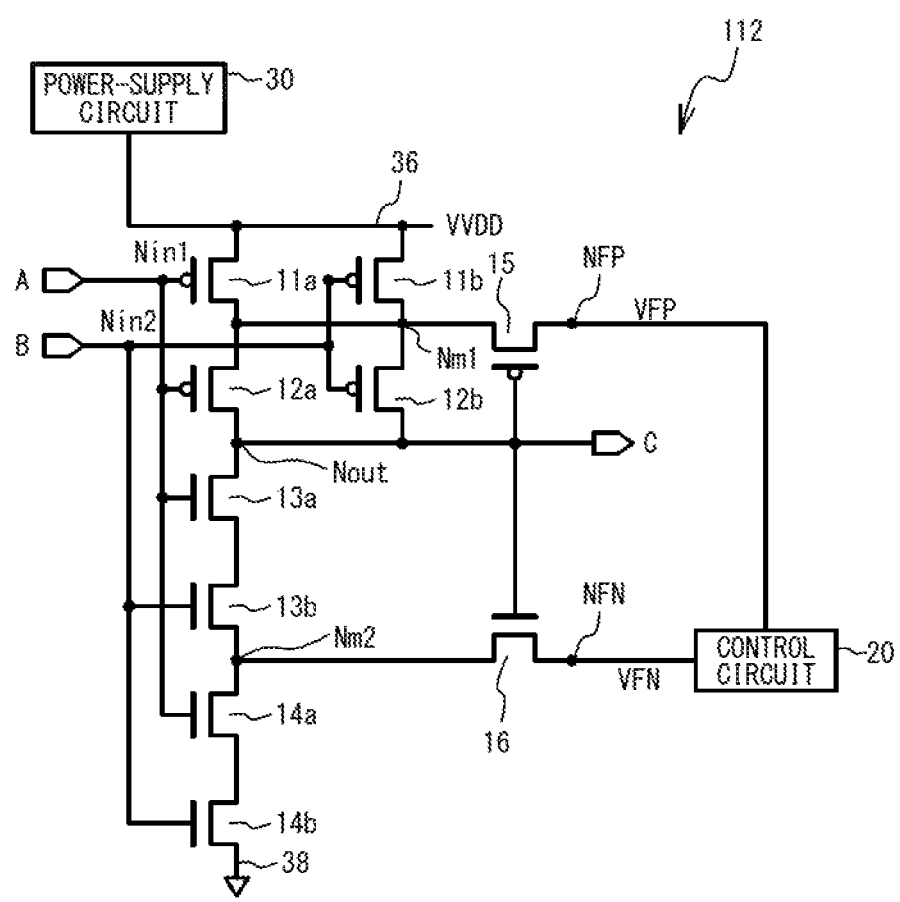
FIG. 21 is a circuit diagram of a NAND circuit to which the fifth embodiment is adopted.

FIG. 21 is a circuit diagram of a NAND circuit using the fifth embodiment. As illustrated in FIG. 21, an electronic circuit 112 includes FETs 11a through 16. Between the power-supply line 36 and the output node Nout, the FETs 11a and 12a are connected in series, the FETs 11b and 12b are connected in series, and the FETs 11a and 12a are connected in parallel to the FETs 11b and 12b. The node between the FETs 11a and 12a and the node between the FETs 11b and 12b are commonly coupled to the intermediate node Nm1.

The FETs 13a through 14b are connected in series between the output node Nout and the ground line 38. The node between the FET 13b and the FET 14a is the intermediate node Nm2. The gates of the FETs 11a through 14a are commonly coupled to an input node Nin1, and the gates of the FETs 11b through 14b are commonly coupled to an input node Nin2. The connection between the FETs 15 and 16 is the same as that of the first embodiment. Other structures are the same as those of the first embodiment, and the description thereof is thus omitted.

In the electronic circuit 112, A and B are input to the input nodes Nin1 and Nin2, respectively. C, which is the NAND of A and B is output to the output node Nout. Although the operating speed is low, the power consumption is reduced by setting the virtual power-supply voltage VVDD at a low voltage (for example, 0.3 V) in the Schmitt trigger mode. High-speed operation is achieved by setting the virtual power-supply voltage VVDD at a high voltage (for example, 1.2 V) in the inverter mode. The NAND circuit has been used as an example, but the fifth embodiment can be adapted to logic circuits (for example, an OR circuit, an AND circuit, an XOR circuit, an NOR circuit) other than the NAND circuit.

Sixth Embodiment

Figures 22A, 22B:
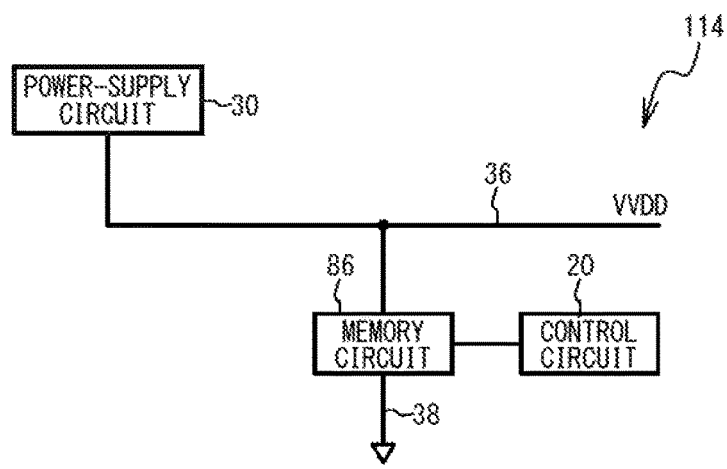
FIG. 22A is a block diagram of an electronic circuit in accordance with a sixth embodiment.
FIG. 22B illustrates operations in each mode of the sixth embodiment.

FIG. 22A is a block diagram of an electronic circuit in accordance with a sixth embodiment, and FIG. 22B illustrates operations in each mode in the sixth embodiment. As illustrated in FIG. 22A, an electronic circuit 114 includes a memory circuit 86, the control circuit 20, and the power-supply circuit 30. The memory circuit 86 includes the bistable circuit 40 according to any one of the second embodiment and the variations thereof. The control circuit 20 outputs a signal switching the modes of the inverter circuit 10 in the memory circuit 86. The power-supply circuit 30 supplies the power-supply line 36 with the virtual power-supply voltage VVDD. When the power-supply circuit 30 is a power switch, the connection of the power switch may be any of those illustrated in FIG. 19A through FIG. 19C. In addition, the power switch may be connected at the ground side, or the power switches may be connected at both the ground side and the power-supply voltage VDD side.

As illustrated in FIG. 22B, when the inverter circuit in the memory circuit 86 is in the inverter mode (in a second mode), there is no hysteresis as illustrated in FIG. 20. In the second mode, when the power-supply circuit 30 supplies a high voltage as the virtual power-supply voltage VVDD, the memory circuit 86 operates at a high-speed. The Schmitt trigger mode includes a first mode and a third mode. In the first mode, the hysteresis is large as the hysteresis of the first embodiment in FIG. 20. When the power-supply circuit 30 supplies a low voltage as the virtual power-supply voltage VVDD, the memory circuit 86 retains data with low power consumption. In the third mode, the hysteresis is smaller than the hysteresis in the first mode as in the fifth embodiment in FIG. 20. In addition, the transfer characteristic of the third mode is steeper than that of the second mode and the same as or gentler than that of the first mode. In the third mode, when the power-supply circuit 30 supplies as the virtual power-supply voltage VVDD a third voltage that is higher than the first voltage and lower than the second voltage, the memory circuit 86 stably operates even at low power consumption although its operating speed is low.

In the sixth embodiment, the inverter circuit 10 in the memory circuit 86 is switched among the first mode, the second mode, and the third mode. The control circuit 20 outputs a third signal setting the inverter circuit 10 in the third mode to the inverter circuit 10 in addition to the first signal and the second signal. The power-supply circuit 30 supplies the third voltage lower than the second voltage as the virtual power-supply voltage VVDD when the inverter circuit 10 is in the third mode. The memory circuit 86 can operate in three modes. In the sixth embodiment, the third voltage is higher than the first voltage, but the third voltage may be the same as or lower than the first voltage.

It is only required that the FETs described in the first through sixth embodiments and the variations thereof are field-effect transistors that operate in the same way as MOSFETs, metal insulator semiconductor (MIS) FETs, metal semiconductor (MES) FETs, FinFETs, and tunnel FETs.

Seventh Embodiment

In the first and second embodiments, as illustrated in FIG. 5A and FIG. 12A, the virtual power-supply voltage VVDD is used as the high level of the voltages VFN and VFP. This is because the power-supply voltage supplied to the control circuit 20 (for example, the inverters 22 and 24) illustrated in, for example, FIG. 2A is set at the virtual power-supply voltage VVDD. Furthermore, when the virtual ground voltage VGND is supplied to the control circuit 20, the low levels of the voltages VFN and VFP are the virtual ground voltage VGND. As described above, the power consumption of the control circuit 20 is reduced by supplying the virtual power-supply voltage VVDD and the virtual ground voltage VGND to the control circuit 20.

Figure 23A:
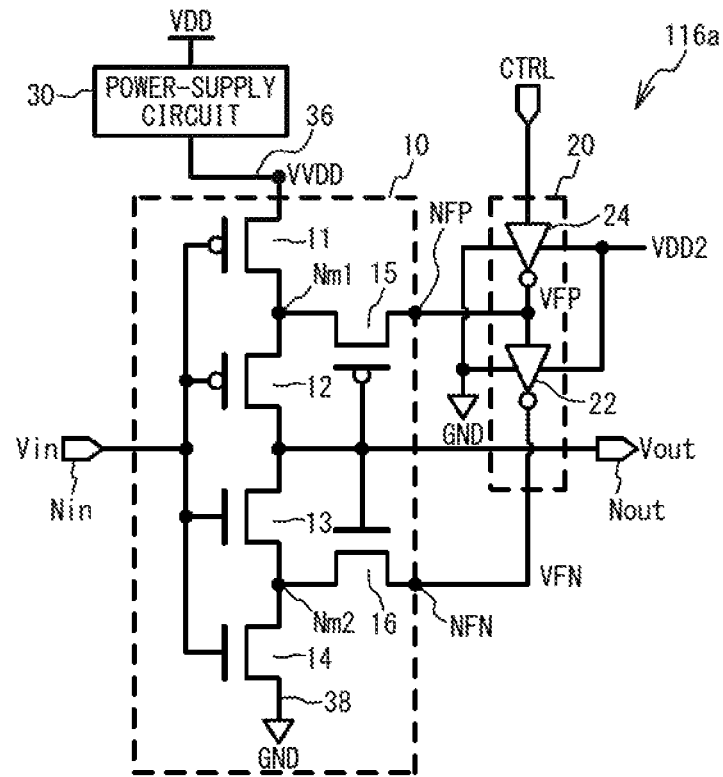
FIG. 23A and FIG. 23B are circuit diagrams of electronic circuits in accordance with a seventh embodiment.
Figure 23B:
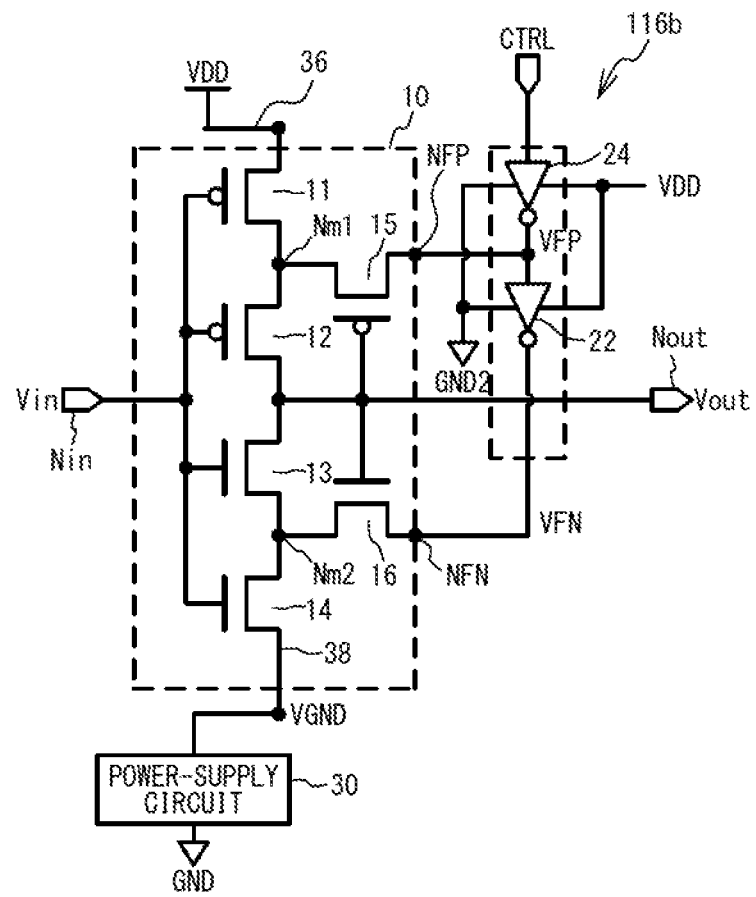

On the other hand, the power-supply voltage and the ground voltage supplied to the control circuit 20 are made to be different from the virtual power-supply voltage VVDD and the virtual ground voltage VGND, respectively. FIG. 23A and FIG. 23B are circuit diagrams of electronic circuits in accordance with a seventh embodiment. As illustrated in FIG. 23A, in an electronic circuit 116a, the power-supply circuit 30 is supplied with the voltage VDD. The inverters 22 and 24 are supplied with the voltage VDD2 as the power-supply voltage and the voltage GND as the ground voltage. The low levels of the voltages VFP and VFN are the voltage GND, and the high levels of the voltages VFP and VFN are the voltage VDD2. Other structures are the same as those of the first embodiment illustrated in FIG. 2A, and the description thereof is thus omitted. For example, the voltage VDD2 is set at the voltage VDD applied to the power-supply circuit 30. This setting allows the high levels of the voltages VFP and VFN to be set at the voltage VDD regardless of the virtual power-supply voltage VVDD supplied by the power-supply circuit 30.

As illustrated in FIG. 23B, in an electronic circuit 116b, the power-supply circuit 30 is located at the ground side. The power-supply circuit 30 supplies the ground line 38 with the virtual ground voltage VGND. The inverters 22 and 24 are supplied with the voltage VDD as a power-supply voltage and the voltage GND2 as a ground voltage. The low levels of the voltages VFP and VFN are the voltage GND2, and the high levels of the voltages VFP and VFN are the voltage VDD. Other structures are the same as those illustrated in FIG. 23A, and the description thereof is thus omitted. For example, the voltage GND2 is set at the ground voltage GND supplied to the power-supply circuit 30. This setting allows the low levels of the voltages VFP and VFN to be set at the ground voltage GND regardless of the virtual ground voltage VGND supplied by the power-supply circuit 30.

The seventh embodiment allows the high levels and the low levels of the voltages VFP and VFN to be different from the virtual power-supply voltage VVDD and the ground voltage VGND, respectively. For example, the high levels and the low levels of the voltages VFP and VFN can be set at the voltages VDD and GND, respectively. Also in the second through sixth embodiments and the variations thereof, the voltages VFP and VFN can be freely set.

Although preferred embodiments of the present invention have been described so far, the present invention is not limited to those particular embodiments, and various changes and modifications may be made to them within the scope of the invention claimed herein.

DESCRIPTION OF REFERENCE NUMERALS 10, 10a, 10b inverter circuit
11-16 FET
20 control circuit
22-26 inverter
30 power-supply circuit
40 bistable circuit

The invention claimed is:

1. An electronic circuit comprising:
a bistable circuit connected between a first power source supplied with a first power-supply voltage and a second power source supplied with a second power-supply voltage lower than the first power-supply voltage, the bistable circuit including a first inverter and a second inverter connected in a loop, the first inverter and the second inverter being inverter circuits configured to switch between a first mode and a second mode;
a control circuit configured to output a first signal and a second signal to the inverter circuits, the first signal setting the inverter circuits in the first mode, the second signal setting the inverter circuits in the second mode; and
a power-supply circuit configured to supply a first voltage as a power-supply voltage, which is a difference between the first power-supply voltage and the second power-supply voltage, while the inverter circuits are in the first mode, and supply a second voltage higher than the first voltage as the power-supply voltage while the inverter circuits are in the second mode, wherein
the first mode is a mode that exhibits hysteresis in a transfer characteristic curve and the second mode is a mode that exhibits no hysteresis in a transfer characteristic curve, and/or the first mode is a mode of which the transfer characteristic curve is steeper than the transfer characteristic curve of the second mode.

2. The electronic circuit according to claim 1, wherein the bistable circuit retains data and does not write or read data in the first mode, and write and read data in the second mode.

3. The electronic circuit according to claim 1, wherein the power-supply circuit switches the second voltage to the first voltage after the control circuit has output the first signal, and switches the first voltage to the second voltage before the control circuit outputs the second signal.

4. The electronic circuit according to claim 1, wherein the inverter circuits switch among the first mode, the second mode, and a third mode,
the third mode exhibits the hysteresis smaller than the hysteresis of the first mode and/or has a transfer characteristic curve steeper than the transfer characteristic curve of the second mode,
the control circuit outputs a third signal setting the inverter circuits in the third mode to the inverter circuits, and
the power-supply circuit supplies a third voltage lower than the second voltage as the power-supply voltage while the inverter circuits are in the third mode.

5. The electronic circuit according to claim 1, further comprising:
a switch configured to turn on and off in synchronization with a clock signal, the switch being located in a loop formed by the first inverter and the second inverter; and
a clock supply circuit configured to supply the clock signal to the switch while the first inverter and the second inverter are in the second mode and not to supply the clock signal to the switch while the first inverter and the second inverter are in the first mode.

6. The electronic circuit according to claim 1, wherein each of the inverter circuits includes:
one or more first P-channel FETs of which sources are coupled to the first power source;
one or more first N-channel FETs of which sources are coupled to the second power source, the one or more first P-channel FETs and/or the one or more first N-channel FETs are a plurality of first FETs connected in series;
an input node to which gates of the one of more first P-channel FETs and gates of the one or more first N-channel FETs are commonly coupled;
an output node to which a drain of an FET farthest from the first power source of the one or more first P-channel FETs and a drain of an FET farthest from the second power source of the one or more first N-channel FETs are commonly coupled; and
a second FET that is at least one of a second P-channel FET and a second N-channel FET that are of a conductive type identical to a conductive type of the plurality of first FETs, one of a source and a drain of the second FET being coupled to an intermediate node located between the plurality of first FETs, a gate of the second FET being coupled to the output node, and another of the source and the drain of the second FET being coupled to a control node to which the first signal and the second signal are input.

7. The electronic circuit according to claim 6, wherein the control circuit outputs, as the first signal, a low level to a control node of the second P-channel FET and/or a high level to a control node of the second N-channel FET, and
the control circuit outputs, as the second signal, a high level to the control node of the second P-channel FET and/or a low level to the control node of the second N-channel FET.

8. The electronic circuit according to claim 6, wherein the one or more first P-channel FETs are connected in series in a plurality and the one or more first N-channel FETs are connected in series in a plurality,
the second FET includes the second P-channel FET and the second N-channel FET,
the control circuit outputs, as the first signal, a low level to the control node of the second P-channel FET and a high level to the control node of the second N-channel FET, and outputs, as the second signal, a high level to the control node of the second P-channel FET and a low level to the control node of the second N-channel FET.

9. The electronic circuit according to claim 1, wherein the power-supply circuit includes a MOSFET connected between at least one of the first power source and the second power source and the inverter circuits.

10. An electronic circuit comprising:
an inverter circuit including:
one or more first P-channel FETs of which sources are coupled to a first power source supplied with a first power-supply voltage;

one or more first N-channel FETs of which sources are coupled to a second power source supplied with a second power-supply voltage lower than the first power-supply voltage, the one or more first P-channel FETs and/or the one or more first N-channel FETs are a plurality of first FETs connected in series;

an input node to which gates of the one or more first P-channel FETs and gates of the one or more first N-channel FETs are commonly coupled;

an output node to which a drain of an FET farthest from the first power source of the one or more first P-channel FETs and a drain of an FET farthest from the second power source of the one or more first N-channel FETs are commonly coupled; and a second FET that is at least one of a second P-channel FET and a second N-channel FET that are of a conductive type identical to a conductive type of the plurality of first FETs, one of a source and a drain of the second FET being coupled to an intermediate node located between the plurality of first FETs, a gate of the second FET being coupled to the output node, and another of the source and the drain of the second FET being coupled to a control node;

a control circuit configured to output a first signal and a second signal to the control node of the second FET, the first signal setting the inverter circuit in a first mode, the second signal setting the inverter circuit in a second mode; and a power-supply circuit configured to supply a first voltage as a power-supply voltage, which is a difference between the first power-supply voltage and the second power-supply voltage, while the inverter circuit is in the first mode, and supply a second voltage higher than the first voltage as the power-supply voltage while the inverter circuit is in the second mode, wherein the control circuit is configured to output, as the first signal, a low level to a control node of the second P-channel FET and/or a high level to a control node of the second N-channel FET, and output, as the second signal, a high level to the control node of the second P-channel FET and/or a low level to the control node of the second N-channel FET, and the first mode is a mode that exhibits hysteresis in a transfer characteristic curve, the second mode is a mode that exhibits no hysteresis in a transfer characteristic curve, and/or the first mode is a mode of which the transfer characteristic curve is steeper than the transfer characteristic curve of the second mode.

11. The electronic circuit according to claim 10, wherein
the one or more first P-channel FETs are connected in series in a plurality and the one or more first N-channel FETs are connected in series in a plurality;
the second FET includes the second P-channel FET and the second N-channel FET; and
the control circuit is configured to output, as the first signal, a low level to the control node of the second P-channel FET and a high level to the control node of the second N-channel FET, and output, as the second signal, a high level to the control node of the second P-channel FET and a low level to the control node of the second N-channel FET.

12. The electronic circuit according to claim 10, further comprising
a logic circuit including the inverter circuit.

13. An electronic circuit comprising:
a bistable circuit connected between a first power source supplied with a first power-supply voltage and a second power source supplied with a second power-supply voltage lower than the first power-supply voltage, the bistable circuit including: a first inverter and a second inverter that form a loop; and a switch that turns on and off in synchronization with a clock signal and is located in the loop;
a clock supply circuit configured to supply the clock signal to the switch; and
a power-supply circuit configured to supply a first voltage as a power-supply voltage, which is a difference between the first power-supply voltage and the second power-supply voltage, while the clock supply circuit is not supplying the clock signal, and supply a second voltage higher than the first voltage as the power-supply voltage while the clock supply circuit is supplying the clock signal,
wherein the clock signal is a periodic signal with a substantially constant period.

* * * * *